(12) United States Patent
Nah et al.

(10) Patent No.: US 9,711,557 B2
(45) Date of Patent: Jul. 18, 2017

(54) SEMICONDUCTOR IMAGE SENSORS HAVING CHANNEL STOP REGIONS AND METHODS OF FABRICATING THE SAME

(71) Applicant: Samsung Electronics Co., Ltd., Suwon-si (KR)

(72) Inventors: Seungjoo Nah, Buk-gu (KR); Jung-Chak Ahn, Yongin-si (KR); Kyung-Ho Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/641,621

(22) Filed: Mar. 9, 2015

(65) Prior Publication Data

US 2016/0035773 A1  Feb. 4, 2016

(30) Foreign Application Priority Data

Aug. 1, 2014 (KR) ........................ 10-2014-0099092

(51) Int. Cl.
*H01L 27/146* (2006.01)

(52) U.S. Cl.
CPC .... *H01L 27/14643* (2013.01); *H01L 27/1463* (2013.01); *H01L 27/14603* (2013.01); *H01L 27/14616* (2013.01); *H01L 27/14689* (2013.01)

(58) Field of Classification Search
CPC ......... H01L 27/14603; H01L 27/14616; H01L 31/0352
See application file for complete search history.

(56) References Cited

U.S. PATENT DOCUMENTS

| 8,426,287 B2 | 4/2013 | Yanagita | |
|---|---|---|---|
| 2005/0139878 A1 | 6/2005 | Han et al. | |
| 2006/0226339 A1* | 10/2006 | Roh | H01L 27/14609 250/208.1 |
| 2007/0145446 A1* | 6/2007 | Lee | H01L 27/14603 257/292 |
| 2012/0112251 A1 | 5/2012 | Forbes et al. | |
| 2012/0230113 A1 | 9/2012 | Tanzawa | |
| 2013/0082312 A1 | 4/2013 | Hung et al. | |
| 2013/0292750 A1 | 11/2013 | Chen et al. | |
| 2013/0323876 A1 | 12/2013 | Lu et al. | |

FOREIGN PATENT DOCUMENTS

| KR | 1020030001798 A | 1/2003 |
|---|---|---|
| KR | 1020030056071 A | 7/2003 |
| KR | 1020060093385 A | 8/2006 |
| KR | 1020100076510 A | 7/2010 |

* cited by examiner

*Primary Examiner* — Jae Lee
(74) *Attorney, Agent, or Firm* — Myers Bigel, P.A.

(57) ABSTRACT

A semiconductor device includes a light-receiving element which outputs electric charges in response to incident light, and a drive transistor which is gated by an output of the light-receiving element to generate a source-drain current in proportion to the incident light, wherein the drive transistor include a first gate electrode, a first channel region which is disposed under the first gate electrode, first source-drain regions which are disposed at respective ends of the first channel region and that have a first conductivity type, and a first channel stop region which is disposed on a side of the first channel region, and that separates the light-receiving element and the first channel region, the first channel stop region having a second conductivity type that is different from the first conductivity type.

18 Claims, 21 Drawing Sheets

| STI type | STI | STI free | | |
|---|---|---|---|---|
| Doping density(cm^2) | - | 2E12 | 5E12 | 8E12 |
| RTS noise [%] | 4.06% | 0.93% | 1.29% | 1.85% |

SEMICONDUCTOR IMAGE SENSORS HAVING CHANNEL STOP REGIONS AND METHODS OF FABRICATING THE SAME

This application claims priority under 35 U.S.C. §119 from Korean Patent Application No. 10-2014-0099092, filed on Aug. 1, 2014 in the Korean Intellectual Property Office, the disclosure of which is incorporated herein by reference in its entirety.

BACKGROUND

1. Field of the Invention

The inventive concepts relate to a semiconductor device and a method of fabricating the same.

2. Description of the Related Art

Transistors are widely used in semiconductor devices. For example, millions of transistors may exist on a single integrated circuit (IC). One common type of transistor is the metal oxide semiconductor field effect transistor (MOSFET). MOSFET transistors include p-type channel transistors and n-type channel transistors. A complementary MOS (CMOS) device include both a p-type channel transistor and an n-type channel transistor in a complementary configuration.

One type of semiconductor device that can be fabricated using the CMOS process is a CMOS image sensor (CIS). One problem of the CIS is that a source follower transistor of each pixel has a large amount of random telegraph signal (RTS) noise which can reduce the sensitivity of the CIS. RTS noise may be caused by charge trap/de-trap in a shallow trench isolation (STI) edge that contacts a channel of the source follower transistor. Generally, RTS noise can be reduced by including an enlarged source follower transistor in a CIS. However, including such a large device may undesirable or not possible in some designs.

SUMMARY

Aspects of the inventive concepts provide a semiconductor device in which random telegraph signal (RTS) noise can be reduced by minimizing a shallow trench isolation (STI) edge in a transistor.

Aspects of the inventive concepts also provide a method of fabricating a semiconductor device in which RTS noise can be reduced by minimizing an STI edge in a transistor.

However, aspects of the inventive concepts are not restricted to the above. The above and other aspects of the inventive concepts will become more apparent to one of ordinary skill in the art by referencing the detailed description below.

According to an aspect of the inventive concepts there is provided a semiconductor device including a light-receiving element which outputs electric charges in response to incident light, and a drive transistor which is gated by an output of the light-receiving element to generate a source-drain current that is proportional to the incident light. The drive transistor includes a first gate electrode, a first channel region under the first gate electrode, first and second source-drain regions which are disposed at respective ends of the first channel region, the first and second source-drain regions having a first conductivity type, and a first channel stop region on a first side of the first channel region, the first channel stop region having a second conductivity type that is different from the first conductivity type.

According to another aspect of the inventive concepts there is provided a semiconductor device including a first channel region in a substrate that has a first segment that extends in a first direction and a second segment that extends in a second direction to intersect the first direction, a second channel region which is electrically connected to the first channel region, the second channel region including a segment that extends in a third direction that intersects the second direction, a first gate electrode on the first channel region, a second gate electrode on the second channel region, the second gate electrode separated from the first gate electrode, a first source-drain region at first end of the first channel region, a second source-drain at a second end of the second channel region and a third source-drain region between the first channel region and the second channel region, the first, second and third source-drain regions having a first conductivity type, and a first channel stop region on a side of a bent portion of the first channel region that has a second conductivity type that is different from the first conductivity type.

According to another aspect of the inventive concepts there is provided a semiconductor device that includes a substrate having a channel region having a first conductivity type formed therein; a first source-drain region at a first end of the channel region; a second source-drain region at a second end of the channel region that is opposite the first end of the channel region; and a first channel stop region in the substrate on a first side of the channel region that has a second conductivity type that is opposite the first conductivity type.

According to another aspect of the inventive concepts there is provided a method of fabricating a semiconductor device, the method including forming a first channel region, which is bent from a first direction to a second direction that intersects the first direction, and a second channel region which is connected to the first channel region and bent from the second direction to a third direction that intersects the second direction, in a substrate, forming source-drain regions by doping both ends of each of the first and second channel regions with a first dopant, forming a first channel stop region by doping a region on a side of the first channel region with a second dopant of a conductivity type opposite to a conductivity type of the first dopant, forming a gate insulating layer on the first or second channel region, and forming gate electrodes on the gate insulating layer.

BRIEF DESCRIPTION OF THE DRAWINGS

The above and other aspects and features of the inventive concepts will become more apparent from the following detailed description of exemplary embodiments thereof with reference to the attached drawings, in which.

DETAILED DESCRIPTION OF THE EMBODIMENTS

Figure 1:
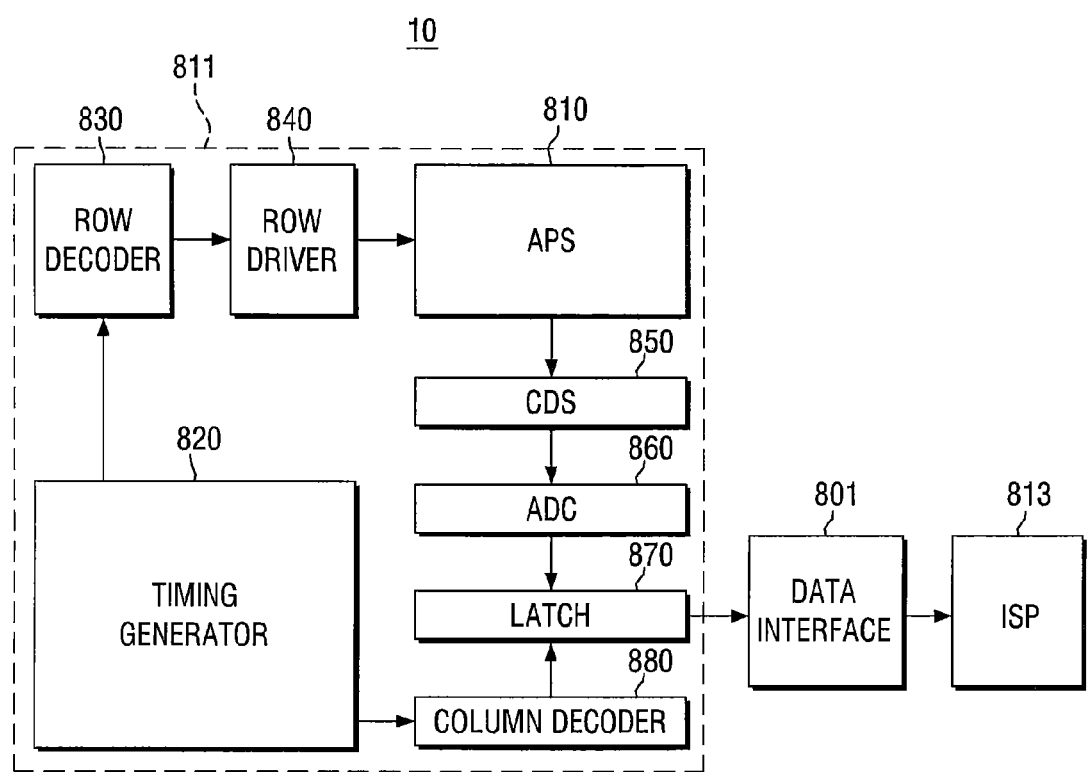
FIG. 1 is a block diagram of an image pickup device according to an embodiment of the inventive concepts.

Advantages and features of the inventive concepts may be understood more readily by reference to the following detailed description of example embodiments and the accompanying drawings. The inventive concepts may, however, be embodied in many different forms and should not be construed as being limited to the embodiments set forth herein. Rather, these embodiments are provided so that this disclosure will be thorough and complete and will fully convey the inventive concepts to those skilled in the art. Like reference numerals refer to like elements throughout the specification.

The terminology used herein is for the purpose of describing particular embodiments only and is not intended to be limiting of the inventive concepts. As used herein, the singular forms "a", "an" and "the" are intended to include the plural forms as well, unless the context clearly indicates otherwise. It will be further understood that the terms "comprises" and/or "comprising," when used in this specification, specify the presence of stated features, operations, elements, and/or components, but do not preclude the presence or addition of one or more other features, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the inventive concepts.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that may be schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which the inventive concepts belong. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Semiconductor devices and methods of fabricating the same according to embodiments of the inventive concepts will hereinafter be described with reference to FIGS. 1 through 18.

FIG. 1 is a block diagram of an image pickup device 10 according to an embodiment of the inventive concepts.

Referring to FIG. 1, the image pickup device 10 may include an image sensor 811 and an image signal processor (ISP) 813. The image sensor 811 may include an active pixel sensor (APS) array 810 composed of pixels (each pixel including a photoelectric converter) that may be arranged in a two-dimensional array, a timing generator 820, a row decoder 830, a row driver 840, a correlated double sampler (CDS) 850, an analog-to-digital converter (ADC) 860, a latch 870, and a column decoder 880.

The unit pixels in the APS array 810 convert optical images into electrical output signals. The APS array 810 may be driven by a plurality of driving signals (including a row select signal, a reset signal and a charge transfer signal) that are received from the row driver 840. The electrical output signals from the APS array 810 may be provided to the CDS 850 through a vertical signal line.

The units pixels in the APS array 810 may include comprise complementary metal oxide semiconductor (CMOS) image pixels. Although not specifically illustrated in the drawing, the pixels included in the APS array 810 may be arranged in a Bayer pattern or a chess mosaic pattern. When Bayer pattern technology is employed, the pixels of the APS array 810 may be arranged to receive red light, green light, and blue light, respectively. However, the inventive concepts are not limited to this arrangement, and the arrangement pattern of the pixels in the APS array 810 can be changed to any appropriate pattern. For example, in other embodiments of the inventive concepts the active pixels of the APS array 810 may be arranged to receive magenta light (Mg), yellow light (Y), cyan light (Cy) and/or white light (W).

The timing generator 820 may provide a timing signal and a control signal to the row decoder 830 and the column decoder 880.

The row driver 840 may provide a plurality of driving signals to the APS array 810 that are used drive the unit pixels based on the decoding result of the row decoder 830. If the unit pixels are arranged in a matrix, the row driver 840 may, for example, provide a driving signal to each row of the matrix.

The CDS 850 may receive an output signal from by the APS array 810 through the vertical signal line and hold and sample the received signal. That is, the CDS 850 may double-sample a particular noise level and a signal level of the output signal and output a difference level that corresponds to a difference between the noise level and the signal level.

The ADC 860 may convert an analog signal corresponding to the difference level into a digital signal and output the digital signal.

The latch 870 may latch the digital signals that are received from the ADC 860 and sequentially transmit the latched signals to the ISP 813 according to the decoding result of the column decoder 880.

The ISP 813 may calibrate the gain of the amount of light of an electrical signal output from the image sensor 811 or adjust the white balance of the electrical signal. The ISP 813 may receive exposure data (i.e., an image signal) of a captured image and remove noise from the received image signal through correction.

A data interface 801 may be located between the image sensor 811 and the ISP 813 and transmit first and second image signals received from the image sensor 811 to the ISP 813.

Figure 2:
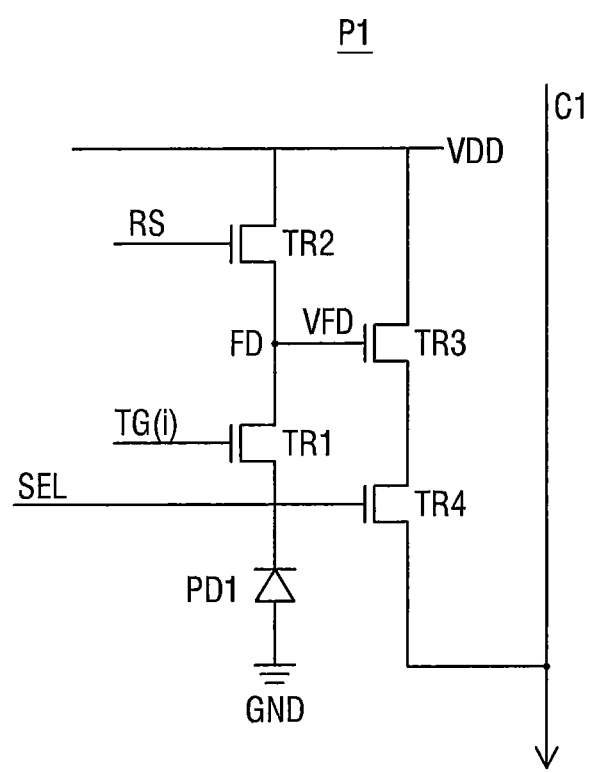
FIG. 2 is a circuit diagram of a pixel included in an active pixel sensor (APS) array of FIG. 1.

FIG. 2 is a circuit diagram of a unit pixel included in the APS array 810 of FIG. 1.

Referring to FIG. 2, a unit pixel P1 of the APS array 810 is connected to a row selection line SEL. The pixel P1 may include a photodiode PD1, a transfer transistor TR1, a reset transistor TR2, a drive transistor TR3, and a select transistor TR4. While FIG. 2 illustrates a pixel having a 4-transistor structure, it will be appreciated that the inventive concepts are not limited thereto. For example, in other embodiments the structure of the pixel can be changed to a 3-transistor structure, a 5-transistor structure, a 6-transistor structure, etc.

The photodiode PD1 is a light-receiving element that receives an external optical image. The photodiode PD1 may generate photocharges in proportion to incident light. In FIG. 2, the photodiode PD1 is illustrated as an example of the light-receiving element. However, the inventive concepts are not limited thereto, and the form of the light-receiving element can be changed as appropriate.

The photodiode PD1 may be connected between the transfer transistor TR1 and a ground terminal GND (or other reference voltage).

The transfer transistor TR1 may transfer photocharges that are generated by the photodiode PD1 to a gate terminal of the drive transistor TR3 via a floating diffusion node FD. The transfer transistor TR1 may have a drain terminal connected to the floating diffusion node FD, a source terminal connected to the photodiode PD1, and a gate terminal connected to the row driver 840 (see FIG. 1). When receiving a transfer control signal TG(i) from the row driver 840 (see FIG. 1), the transfer transistor TR1 may be turned on to provide an output of the photodiode PD1 to the floating diffusion node FD.

The reset transistor TR2 may apply a reset voltage to the gate terminal of the drive transistor TR3. The reset transistor TR2 may have a drain terminal connected to a driving power source terminal VDD, a source terminal connected to the floating diffusion node FD, and a gate terminal connected to the row driver 840 (see FIG. 1). When receiving a reset control signal RS from the row driver 840 (see FIG. 1), the reset transistor TR2 may be turned on to provide an output of the power source terminal VDD to the gate terminal of the drive transistor TR3 via the floating diffusion node FD. When the output of the power source terminal VDD is provided to the gate terminal of the drive transistor TR3, the drive transistor TR3 may be completely turned on. Accordingly, an output of the drive transistor TR3 may be reset.

The drive transistor TR3 generates a source-drain current in proportion to the magnitude of photocharge applied to the gate terminal thereof via the transfer transistor TR1. Specifically, a floating diffusion voltage VFD is generated in the floating diffusion node FD that is proportional to the magnitude of photocharge generated by the photodiode PD1. When the floating diffusion voltage VFD is applied to the gate terminal of the drive transistor TR3, the source-drain current of the drive transistor TR3 that is proportional to the amount of photocharges may be generated.

For this operation, the drive transistor TR3 may have a drain terminal that is connected to the power source terminal VDD, a source terminal that is connected to a drain terminal of the select transistor TR4, and a gate terminal that is connected to the floating diffusion node FD which is a common terminal that is connected to the drain terminal of the transfer transistor TR1 and to the source terminal of the reset transistor TR2.

The select transistor TR4 may transfer a current generated by the drive transistor TR3 to a column line C1. The select transistor TR4 may have the drain terminal that is connected to the source terminal of the drive transistor TR3, a source terminal that is connected to the column line C1, and a gate terminal that is connected to the row selection line SEL. The select transistor TR4 may be gated by a signal that is transmitted to the row selection line SEL and thus may output a source-drain current (e.g., an image signal) that is generated by the drive transistor TR3 to the column line C1. However, the inventive concepts are not limited to this particular arrangement.

Figure 3:
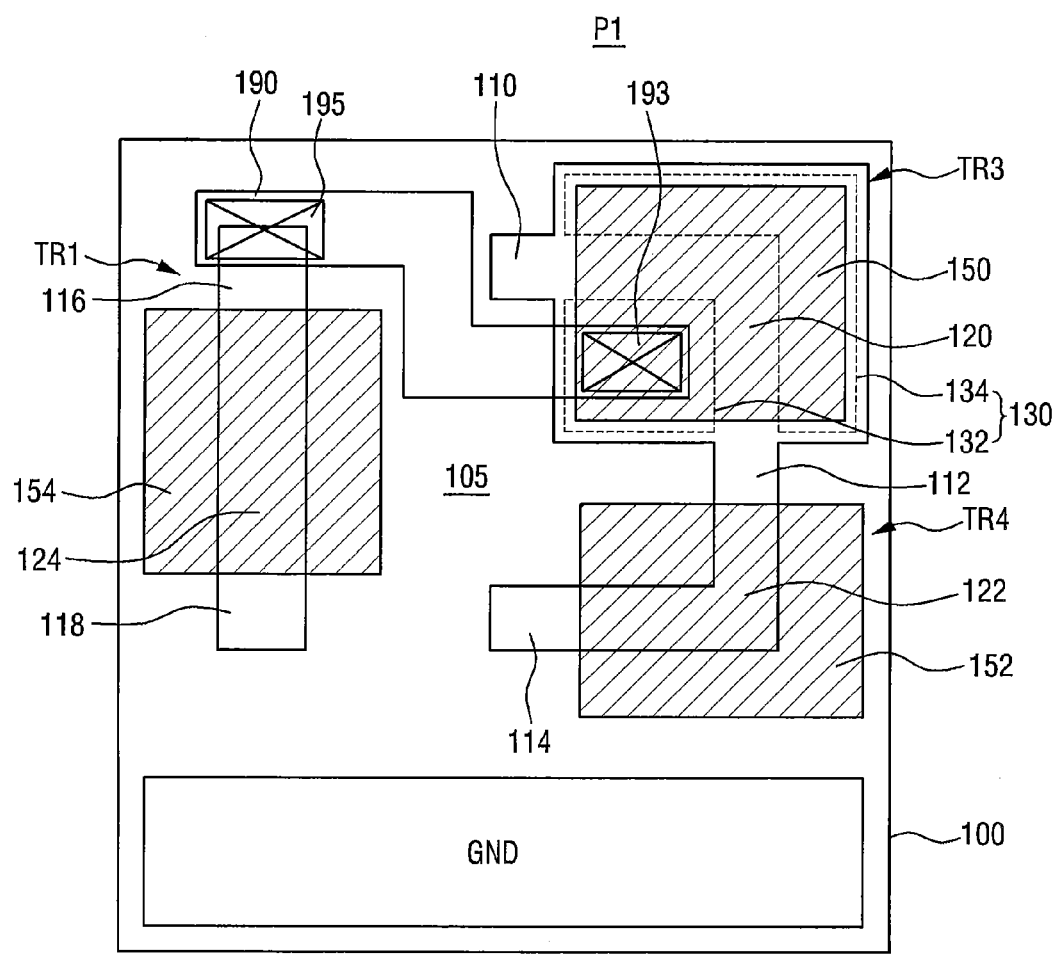
FIG. 3 is a layout view of a pixel included in the APS array of FIG. 1.

FIG. 3 is a layout view of a pixel that is included in the APS array 810 of FIG. 1.

Referring to FIG. 3, a unit pixel (e.g., P1 of FIG. 2) of the APS array 810 (see FIG. 1) may include the transfer transistor TR1, the drive transistor TR3, the select transistor TR4, and the ground terminal GND within a rectangular cell. Although not specifically illustrated in the drawing, the pixel P1 may further include the photodiode PD1 and the reset transistor TR2 within the cell.

The pixel P1 may include a plurality of gate regions (150, 152, 154), a plurality of channel regions (120, 122, 124), a plurality of source-drain regions 110, 112, 114, 116 and 118, a shallow trench isolation (STI) region 105, a channel stop region 130, and a ground (GND) region.

The channel regions (120, 122, 124) may include a first channel region 120, a second channel region 122, and a third channel region 124. The channel regions (120, 122, 124) may be formed in a substrate.

The first channel region 120 may be a channel of the drive transistor TR3 that is described above with reference to FIG. 2. The first channel region 120 may be bent from a first direction to a second direction that intersects the first direction. For example, the first channel region 120 may be bent at a right angle so that the second direction is perpendicular to the first direction, but the inventive concepts are not limited to this arrangement. The source-drain regions 110 and 112 may be disposed at the respective ends of the first channel region 120, and a first channel stop region 132 may be disposed on a side (e.g., an inner side) of the bent first channel region 120. The first channel stop region 132 may be a counter-doped region with respect to the source-drain regions 110 and 112. That is, the first channel stop region 132 may have a conductivity type different from that of the source-drain regions 110 and 112. The first channel stop region 132 will be described in greater detail later. The STI region 105 (which may alternatively be a deep trench isolation (DTI) region) may be disposed on the other side of the bent first channel region 120. The first channel region 120 may have a predetermined width. However, the inventive concepts are not limited thereto.

A second channel stop region 134 may be disposed on another side (e.g., an outer side) of the bent first channel region 120. The second channel stop region 134 may be substantially the same as the first channel stop region 132. That is, the second channel stop region 134 may have a conductivity type that is different from the conductivity type of the source-drain regions 110 and 112. However, the inventive concepts are not limited thereto, and the second channel stop region 134 may include a STI or DTI region.

The second channel region 122 may be a channel of the select transistor TR4 that is described above with reference to FIG. 2. The second channel region 122 may be electrically connected to the first channel region 120. The second channel region 122 may be bent from the second direction to a third direction that intersects the second direction. For example, the first channel region 120 may be bent at a right angle such that the first and third directions are parallel to each other. Therefore, the first channel region 120 and the second channel region 122 may be arranged in a 'ㄷ' shape, but the inventive concepts are not limited thereto.

The source-drain regions 112 and 114 may be disposed at the respective ends of the second channel region 122. The STI region 105 or the DTI region may be disposed on both sides of the bent second channel region 122. The second channel region 122 may have a predetermined width. However, the inventive concepts are not limited thereto.

The third channel region 124 may be a channel of the transfer transistor TR1 that is described above with reference to FIG. 2. The third channel region 124 may be separated from the first channel region 120 or the second channel region 122. However, the inventive concepts are not limited thereto, and the third channel region 124 can also be connected to the first channel region 120 or the second channel region 122. The source-drain regions 116 and 118 may be disposed at the respective ends of the third channel region 124. Although not specifically illustrated in FIG. 3, the source region 118 may be connected to the photodiode (i.e., the light-receiving element) PD1 (see FIG. 2) which outputs electric charges in response to incident light, and photocharges generated by the photodiode PD1 (see FIG. 2) may be transferred to the drain region 116 via the third channel region 124. The drain region 116 may be connected to a connection line 190 that is located above the drain region 116 by a contact 195, and the connection line 190 may be electrically connected to a first gate electrode 150 by a contact 193. Accordingly, photocharges generated by the photodiode (i.e., the light-receiving element) (not illustrated) may be transferred to the first gate electrode 150 via the third channel region 124. The connection line 190 may be straight, may be bent multiple times or have any other appropriate shape and/or configuration.

The gate regions (150, 152, 154) may include the first gate electrode 150, a second gate electrode 152, and a third gate electrode 154. The first gate electrode 150, the second gate electrode 152, and the third gate electrode 154 may be separated from one another.

The first gate electrode 150 may be disposed on the first channel region 120 and completely overlap the first channel region 120. The first gate electrode 150 may be gated by an output of the photodiode (i.e., the light-receiving element) PD1 (see FIG. 2) which outputs electric charges in response to incident light. However, the inventive concepts are not limited thereto.

The second gate electrode 152 may be disposed on the second channel region 122 and may completely overlap the second channel region 122. Likewise, the third gate electrode 154 may be disposed on the third channel region 124 and may completely overlap the third channel region 124.

The source-drain regions 110 and 112 of the drive transistor TR3 may be disposed on a side of the first gate electrode 150 or at both ends of the first channel region 120. The source-drain regions 110 and 112 may be disposed on the same layer as the first channel region 120. Likewise, the source-drain regions 112 and 114 of the select transistor TR4 may be disposed on a side of the second gate electrode 152 or at both ends of the second channel region 122 and may be disposed on the same layer as the second channel region 122. The source-drain regions 116 and 118 of the transfer transistor TR1 may be disposed on a side of the third gate electrode 154 or at both ends of the third channel region 124 and may be disposed on the same layer as the second channel region 122.

The GND region may be disposed on a side of the pixel P1, but the inventive concepts are not limited thereto.

The STI region 105 may be disposed among the transistors TR1, TR3 and TR4. The DTI region (not illustrated) may be disposed on the periphery of the pixel P1, but the inventive concepts are not limited thereto.

The channel stop region 130 will be described in greater detail later with reference to the attached drawings.

Figure 4:
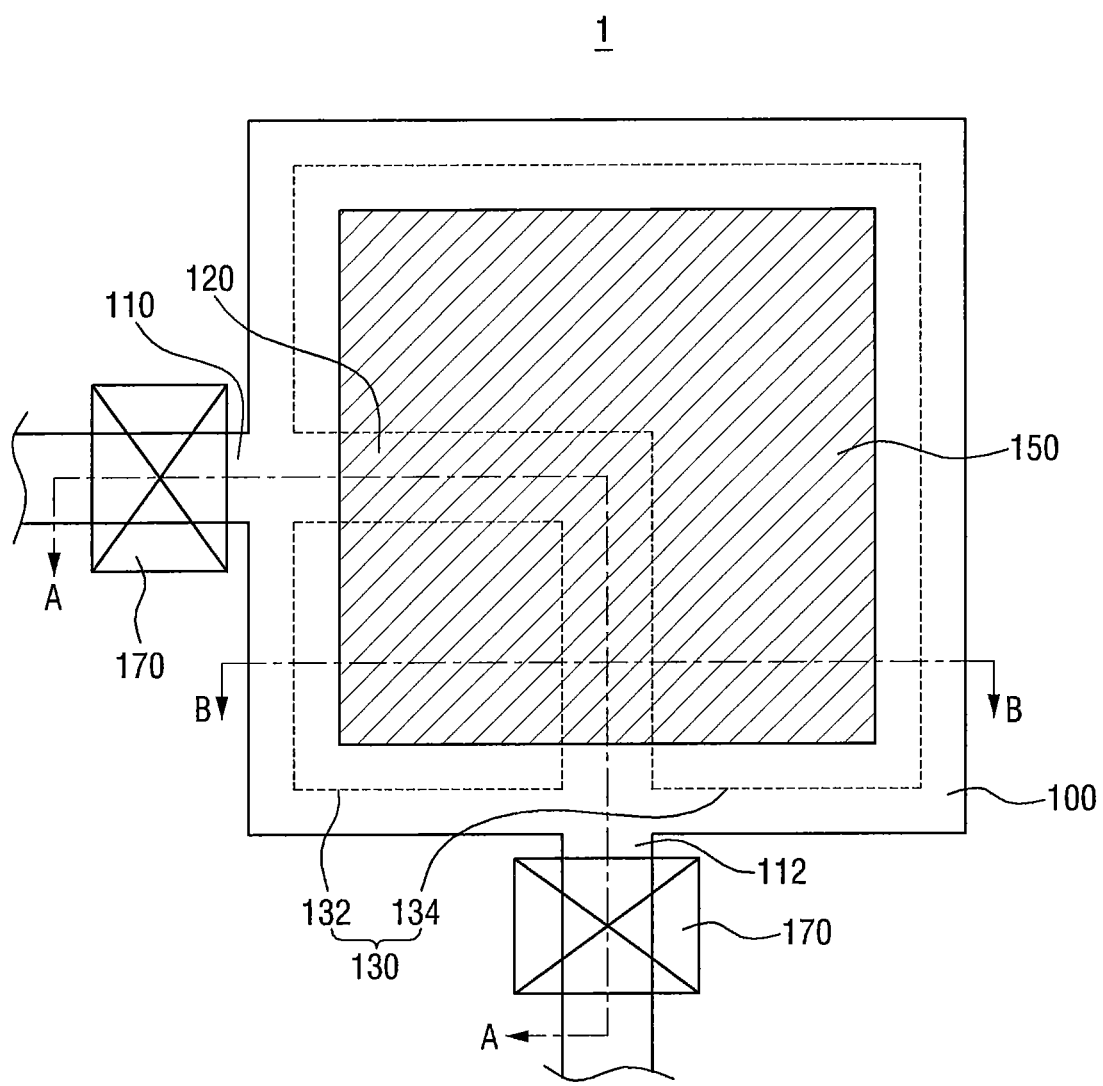
FIG. 4 is a layout view of a semiconductor device according to a first embodiment of the inventive concepts.
Figure 5:
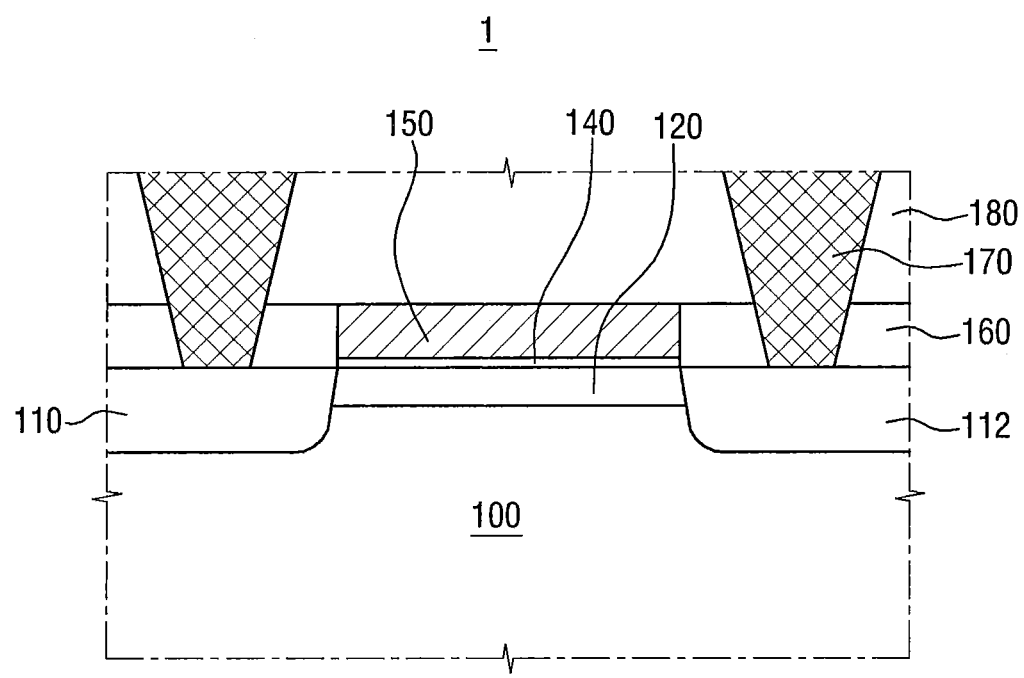
FIG. 5 is a cross-sectional view taken along the line A-A of FIG. 4.
Figure 6:
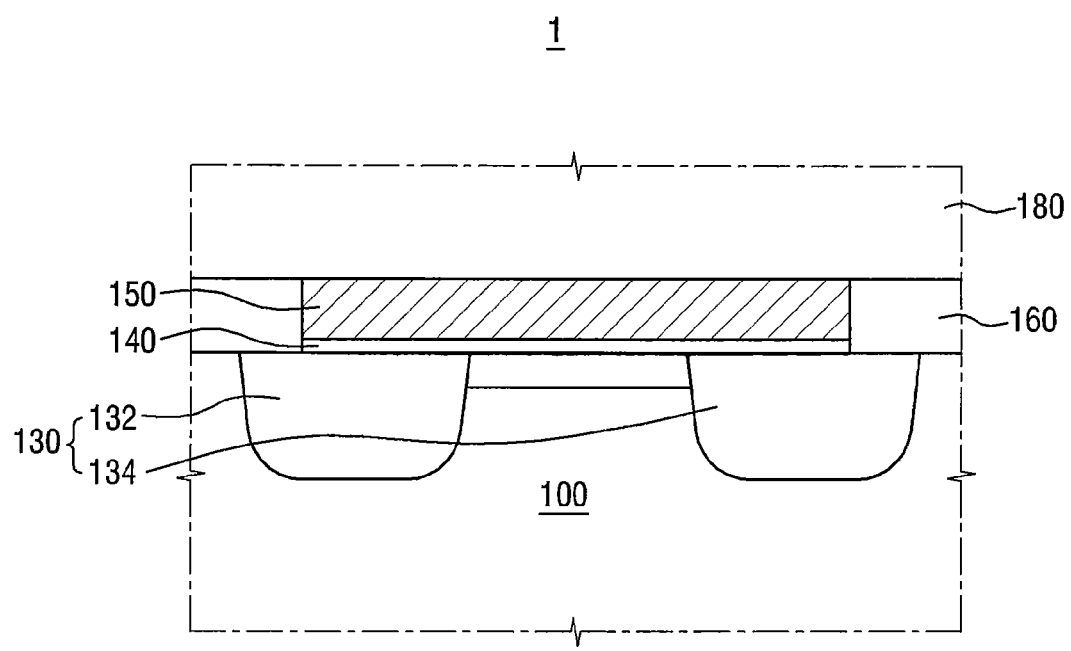
FIG. 6 is a cross-sectional view taken along the line B-B of FIG. 4.

FIG. 4 is a layout view of a semiconductor device 1 according to a first embodiment of the inventive concepts. FIG. 5 is a cross-sectional view taken along the line A-A of FIG. 4. FIG. 6 is a cross-sectional view taken along the line B-B of FIG. 4.

Referring to FIGS. 4 through 6, the semiconductor device 1 according to the current embodiment includes a bent channel region 120.

The semiconductor device 1 may include a drive transistor TR3 which is gated by an output of a photodiode (i.e., a light-receiving element) P1 (see FIG. 1) to generate a source-drain current in proportion to incident light.

The semiconductor device 1 includes a substrate 100, the channel region 120, source-drain regions 110, 112, a gate insulating layer 140, a gate electrode 150, and source-drain contacts 170.

The substrate 100 may be a semiconductor substrate. For example, the substrate 100 may be made of silicon (Si), strained silicon, a silicon alloy, silicon carbide (SiC), silicon germanium (SiGe), silicon germanium carbide (SiGeC), germanium (Ge), a germanium alloy, gallium arsenide (GaAs), indium arsenide (InAs), a III-V semiconductor, a II-VI semiconductor, or any combination or stack of the above materials. The substrate 100 may also be an organic plastic substrate instead of a semiconductor substrate. A case where the substrate 100 is made of silicon will hereinafter be described as an example, but the inventive concepts are not limited to this case.

The substrate 100 may be a P type substrate or an N type substrate. In some embodiments of the inventive concepts, the substrate 100 may be an insulating substrate having a semiconductor layer thereon. For example, the substrate 100 may be a silicon-on-insulator (SOI) substrate. When a SOI substrate is used, it may be possible to reduce the delay time in the operation process of a transistor.

The channel region 120 may be disposed under the gate electrode 150 and between the source-drain regions 110, 112. The channel region 120 may be formed in the substrate 100. The channel region 120 may be bent from a first direction to a second direction that intersects the first direction. For example, the first channel region 120 may be bent at a right angle, but the inventive concepts are not limited thereto.

The channel stop region 130 may be disposed on, e.g., both sides of the channel region 120. The channel stop region 130 is a counter-doped region with respect to the source-drain regions 110, 112. That is, the channel stop region 130 may have a different conductivity type from the source-drain regions 110, 112. Specifically, the source-drain regions 110, 112 may include a first dopant in a first concentration, and the channel stop region 130 may include a second dopant in a second concentration, where the second dopant has an opposite conductivity type from the first dopant. For example, if the substrate 100 is an N-type substrate, the first dopant may include a P-type dopant, and the second dopant may include an N type dopant such as phosphorous (P) or arsenic (As). In addition, if the substrate 100 is a P-type substrate, the first dopant may include an N-type dopant, and the second dopant may include a P type dopant such as boron (B). Here, the first concentration may be, but is not limited to, higher than the second concentration.

The source-drain regions 110, 112 may be disposed at the respective ends of the channel region 120 and may have a first conductivity type. The source-drain regions 110, 112 may contact respective source-drain contacts 170 (the source-drain contacts 170 are not illustrated in FIG. 3). The source-drain regions 110, 112 may be formed deeper into the substrate 100 than the channel region 120. A first interlayer insulating film 160 may be formed on the source-drain regions 110, 112.

The channel stop region 130 may be disposed on opposing sides of the channel region 120 and may have a second conductivity type that is different from the first conductivity type of the source-drain regions 110, 112. The channel stop region 130 may include a first channel stop region 132 and a second channel stop region 134.

The first channel stop region 132 and the second channel stop region 134 may be disposed on opposite sides of the channel region 120 and may contact both side surfaces of the channel region 120.

The first channel stop region 132 may be disposed on the inner side of the bent channel region 120. The first channel stop region 132 may be formed deeper in the substrate 100 than the channel region 120 and may be formed to a depth equal to or greater than the depths of the source-drain regions 110, 112. The first channel stop region 132 may be formed to a depth in the substrate 100 that is shallower than a depth of the STI region 105, but the inventive concepts are not limited thereto. The first channel stop region 132 may be rectangular. The first gate electrode 150 may overlap a portion of the first channel stop region 132, and another portion of the first channel stop region 132 may not be overlapped by the first gate electrode 150. Although not specifically illustrated in FIGS. 4-6, the channel region 120 may be formed on a side of the first channel stop region 132, and the STI region 105 may be formed on another side of the first channel stop region 132. However, the inventive concepts are not limited thereto.

The second channel stop region 134 may be disposed on the outer side of the bent channel region 120. The second channel stop region 134 may be formed deeper in the substrate 100 than the channel region 120 and may be formed to a depth that is equal to or greater than the depth of the source-drain regions 110, 112. The second channel stop region 134 may be formed to a depth in the substrate 100 that is shallower than the depth of the STI region 105, but the inventive concepts are not limited thereto. The second channel stop region 134 may be formed in a '㄀' shape and may be bent from the first direction to the second direction that intersects the first direction. The first gate electrode 150 may overlap a portion of the second channel stop region 134. The first gate electrode 150 may not overlap another portion of the second channel stop region 134. However, the inventive concepts are not limited thereto.

The first channel stop region 132 and the second channel stop region 134 may define the channel region 120. The first channel stop region 132 and the second channel stop region 134 may contact the side surfaces of the channel region 120. The channel stop region 130 can increase a voltage threshold value compared with the STI region 105, and the increased voltage threshold value can reduce random telegraph signal (RTS) noise by hindering or reducing the flow of electric current in an edge region during the operation of the semiconductor device 1. That is, RTS noise can be reduced in the semiconductor device 1 of the inventive concepts compared with a semiconductor device in which the STI region 105 and the channel region 120 contact each other.

Referring to FIG. 6, a cross section of each of the first channel stop region 132 and the second channel stop region 134 has a quadrilateral shape with round corners. However, the cross-sectional shape of each of the first channel stop region 132 and the second channel stop region 134 is not limited to a quadrilateral shape. In some embodiments of the inventive concepts the cross section of each of the first channel stop region 132 and the second channel stop region 134 can have, for example, a tapered shape or a quadrilateral shape.

The gate insulating layer 140 may be formed on the channel region 120 and/or in the channel stop region 130. The gate insulating layer 140 may be disposed under the gate electrode 150. The gate insulating layer 140 may be made of a high-k material. In some embodiments of the inventive concepts, the gate insulating layer 140 may be made of, but not limited to, $HfO_2$, $Al_2O_3$, $ZrO_2$, $TaO_2$, etc.

Although not specifically illustrated in the drawings, an interface layer may additionally be formed between the gate insulating layer 140 and the channel region 120 to provide an improved interface between the gate insulating layer 140 and the channel region 120. The interface layer may include a low-k material layer having a dielectric constant (k) of 9 or less such as a silicon oxide layer (having a dielectric constant k of approximately 4) or a silicon oxynitride layer (having a dielectric constant k of approximately 4 to 8 depending on the relative content of oxygen and nitrogen atoms). Alternatively, the interface layer may be made of silicate or any combination of the above example layers. However, the inventive concepts are not limited thereto.

The first gate electrode 150 may be disposed on the gate insulating layer 140. The first gate electrode 150 may include a conductive material. In some embodiments of the inventive concepts the first gate electrode 150 may include a high conductivity metal. However, the inventive concepts are not limited thereto. That is, in some other embodiments of the inventive concepts, the first gate electrode 150 may be made of non-metal such as, for example, polysilicon.

The first interlayer insulating film 160 may be formed on the substrate 100. In addition, the first interlayer insulating film 160 may be formed on the source-drain regions 110, 112 and/or the channel stop region 130. The first interlayer insulating film 160 may be disposed on the same layer as the gate electrode 150 (i.e., at the same height above a bottom surface of the substrate 100). The first interlayer insulating film 160 may electrically insulate conductive elements (e.g., semiconductor elements) that are disposed thereunder from conductive elements that are disposed thereon. The first interlayer insulating film 160 may be made of silicon oxide such as borosilicate glass (BSG), phosphosilicate glass (PSG), borophosphosilicate glass (BPSG), undoped silicate glass (USG), tetraethylorthosilicate glass (TEOS), or high density plasma-chemical vapor deposition (HDP-CVD).

A second interlayer insulating film 180 may be formed on the first interlayer insulating film 160 or the first gate electrode 150. Like the first interlayer insulating film 160, the second interlayer insulating film 180 may electrically insulate conductive elements that are disposed thereunder from conductive elements that are disposed thereon. The second interlayer insulating film 180 may be made of, for example, silicon oxide such as BSG, PSG, BPSG, USG, TEOS, or HDP-CVD.

The source-drain contacts 170 may be electrically connected to the source-drain regions 110, 112, respectively. The source-drain contacts 170 may penetrate through the first interlayer insulating film 160 and the second interlayer insulating film 180 to contact the source-drain regions 110, 112, but the inventive concepts are not limited thereto.

Figure 7:
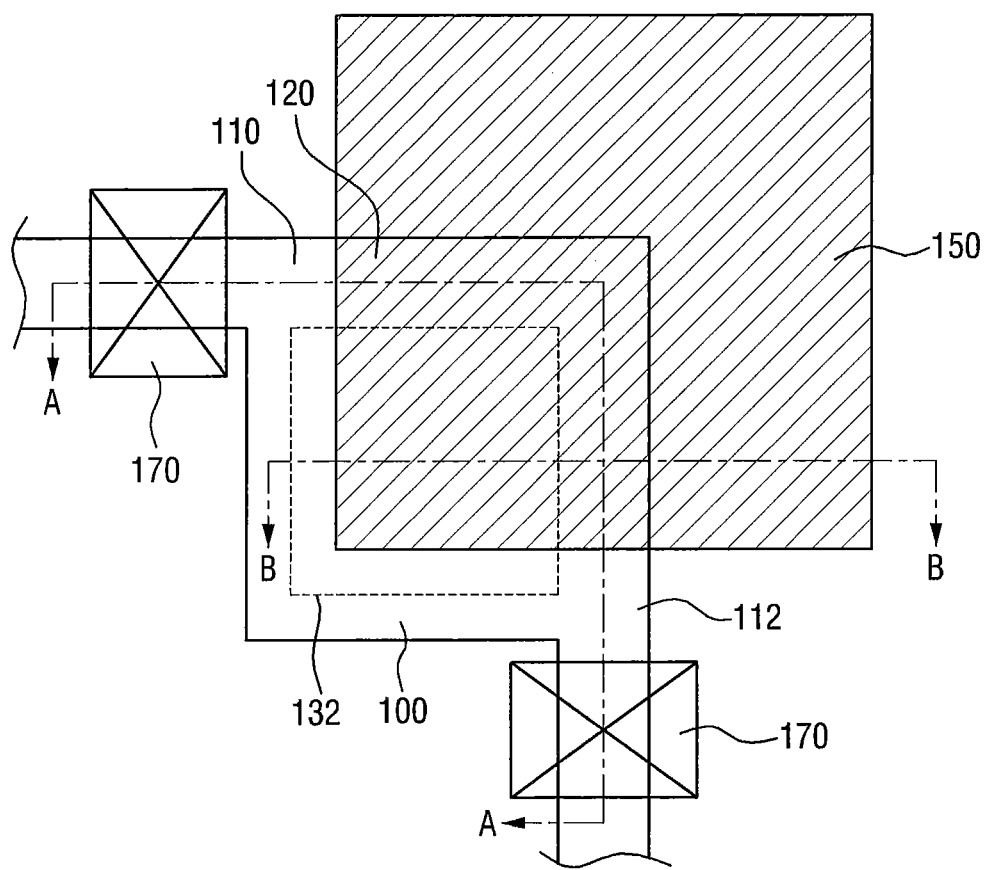
FIG. 7 is a layout view of a semiconductor device according to a second embodiment of the inventive concepts.
Figure 8:
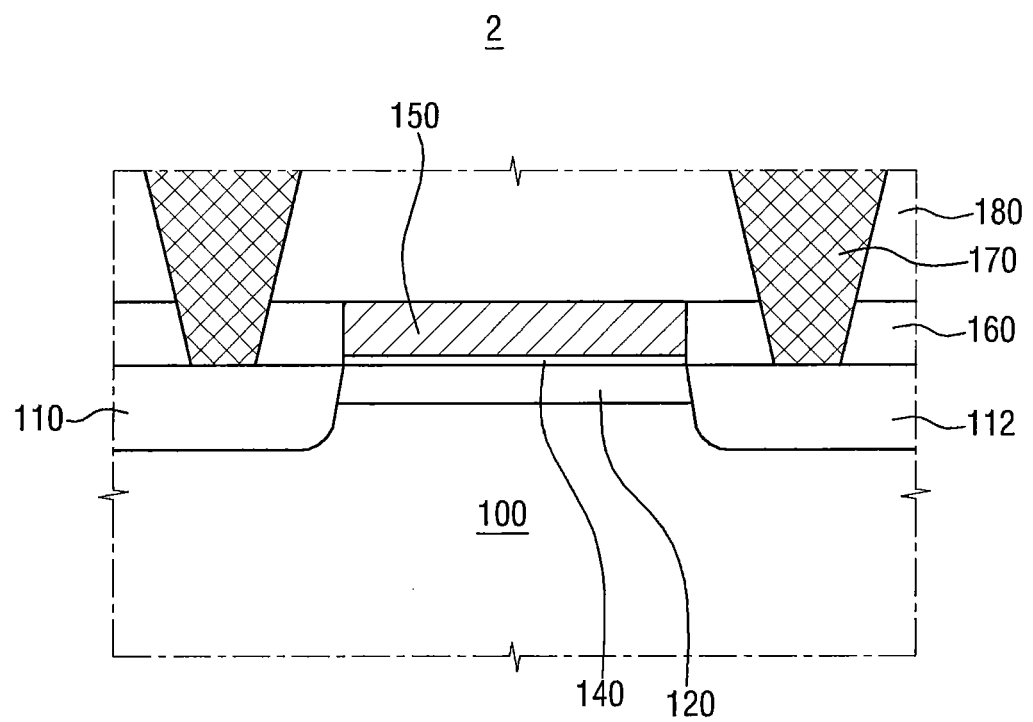
FIG. 8 is a cross-sectional view taken along the line A-A of FIG. 7.
Figure 9:
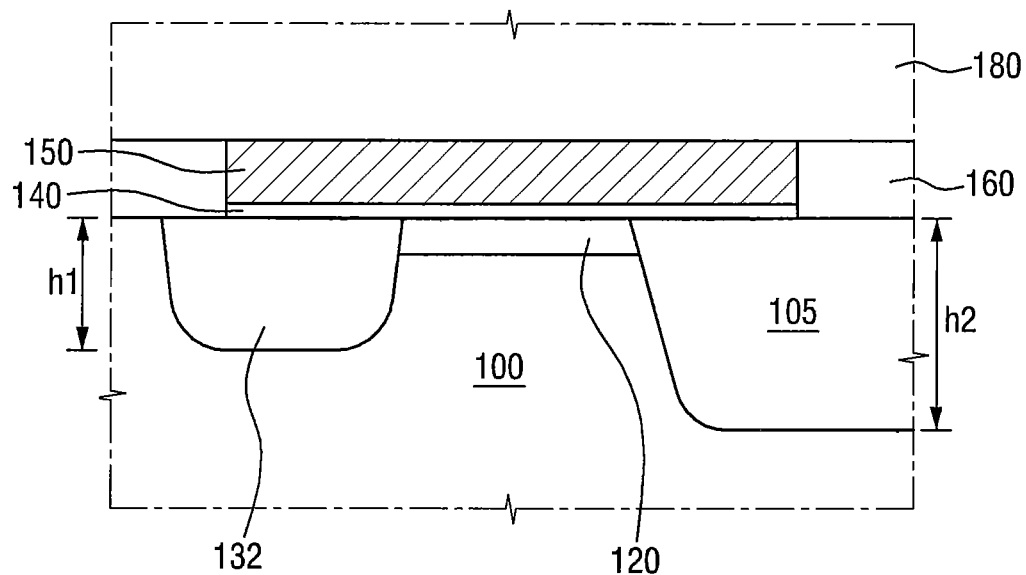
FIG. 9 is a cross-sectional view taken along the line B-B of FIG. 7.

FIG. 7 is a layout view of a semiconductor device 2 according to a second embodiment of the inventive concepts. FIG. 8 is a cross-sectional view taken along the line A-A of FIG. 7. FIG. 9 is a cross-sectional view taken along the line B-B of FIG. 7. For simplicity, a redundant description of elements identical to those of the above-described first embodiment will be omitted, and the description of the second embodiment will focus mainly on differences from the above-described first embodiment.

Referring to FIGS. 7 through 9, the semiconductor device 2 includes a bent channel region 120. The semiconductor device 2 may be substantially the same as the semiconductor device (i.e., the transistor) 1 described above with reference to FIGS. 4 through 6. The semiconductor device 2 may include a substrate 100, the channel region 120, source-drain regions 110, 112, a channel stop region 132, a gate insulating layer 140, a gate electrode 150, and source-drain contacts 170.

The channel stop region 132 of the semiconductor device 2 may be formed on one side of the channel region 120, and an STI region 105 may be formed on the other side of the channel region 120. In other words, the channel stop region 134 that is included in the embodiment of FIGS. 4-6 is omitted in the embodiment of FIGS. 7-9. While an STI region 105 is shown as being provided in place of the channel stop region 134 in the embodiment of FIGS. 7-9, the inventive concepts are not limited thereto. For example, in still other embodiments a DTI region may be provided instead of the STI region 105 on the side of the channel region 120 opposite the channel stop region 132.

The channel stop region 132 may have a second conductivity type that is different from a first conductivity type of the source-drain regions 110, 112. The channel stop region 132 may be disposed only on a first side (here the inner side) of the bent channel region 120. The channel stop region 132 may be formed deeper in the substrate 100 than the channel region 120 and may be formed, and may be formed to a depth that is equal to or greater than the depths of the source-drain regions 110, 112. The channel stop region 132 may be formed to a depth in the substrate 100 that is shallower than the depth of the STI region 105 that is disposed on the other side of the channel region 120, as shown in FIG. 9. For example, the channel stop region 132 may be formed to a first depth h1, and the STI region 105 may be formed to a second depth h2. The first depth h1 may be smaller than the second depth h2. However, the inventive concepts are not limited thereto, and the first depth h1 can also be equal to the second depth h2. The channel stop region 132 may be rectangular in plan view. The first gate electrode may overlap a portion of the channel stop region 132, while the first gate electrode may not overlap the remainder of the channel stop region 132.

The STI region 105 is formed in the substrate 100 to define an active region. The STI region 105 may contact the channel region 120. The STI region 105 may have a shallow trench structure which is advantageous for high integration because it has superior element isolation characteristics and occupies a small area, but the inventive concepts are not limited thereto. The STI region 105 may include at least one of, e.g., silicon oxide, silicon nitride, silicon oxynitride, and combinations of the same. In the drawings, the STI region 105 has a tapered cross-sectional shape which becomes wider from the top toward the bottom. However, the cross-sectional shape of the STI region 105 is not limited to the tapered shape. In some embodiments of the inventive concepts the cross-sectional shape of the STI region 105 may be changed to a quadrilateral shape. In other embodiments of the inventive concepts the STI region 105 may have a cross-sectional shape with round corners.

The channel stop region 132 and the STI region 105 may define the channel region 120. The channel stop region 132 and the STI region 105 may contact opposed side surfaces of the channel region 120. A voltage threshold value may be higher in a contact area between the channel stop region 132 and the channel region 120 than in a contact area between the channel stop region 132 and the STI region 105. The higher voltage threshold value may hinder or reduce the flow of electric current in an edge region during the operation of the semiconductor device 2, thereby reducing RTS noise in the semiconductor device 2.

Figure 10:
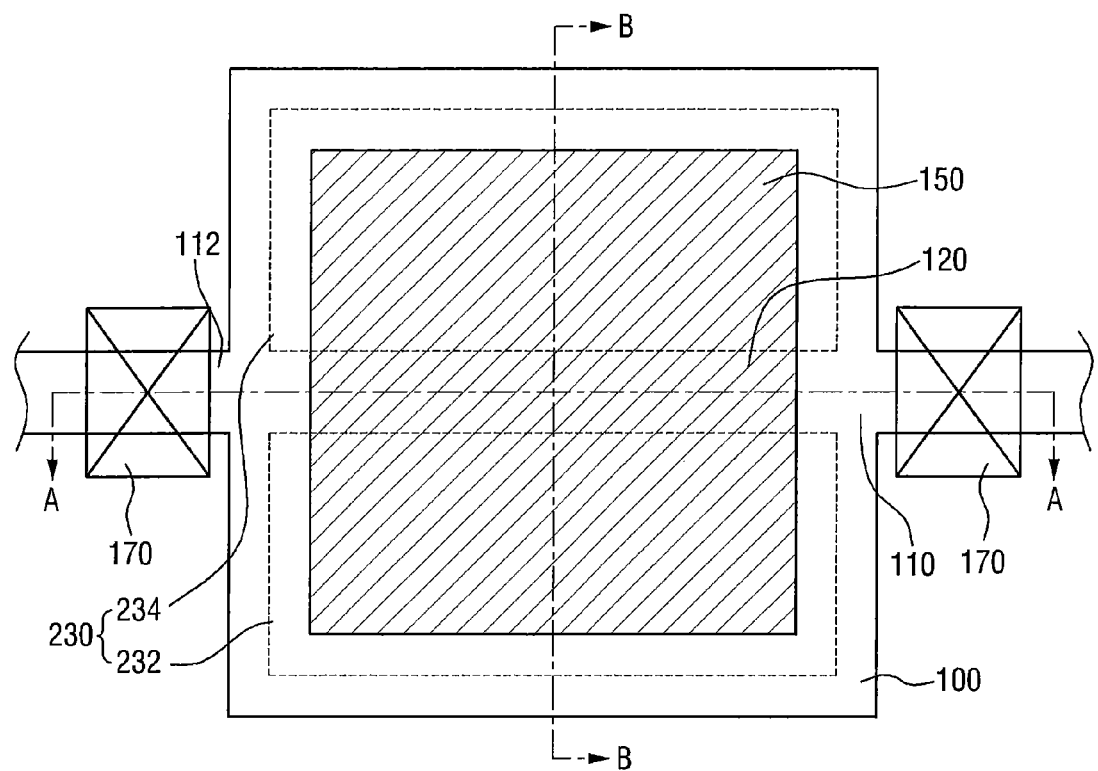
FIG. 10 is a layout view of a semiconductor device according to a third embodiment of the inventive concepts.

FIG. 10 is a layout view of a semiconductor device 3 according to a third embodiment of the inventive concepts. For simplicity, a redundant description of elements identical to those of the above-described first and second embodiments will be omitted, and the description of the semiconductor device 3 will focus mainly on differences from the above-described embodiments.

Referring to FIG. 10, the semiconductor device 3 includes a straight channel region 120. The semiconductor device 3 includes a substrate 100, the channel region 120, source-drain regions 110, 112, a channel stop region 230, a gate insulating layer 140, a first gate electrode 150, and source-drain contacts 170. A cross-sectional view of the semiconductor device 3 taken along the line A-A of FIG. 10 may be substantially the same as FIG. 5. Likewise, a cross-sectional of the semiconductor device 3 taken along the line B-B of FIG. 10 may be substantially the same as FIG. 6.

The channel region 120 may be disposed under the first gate electrode 150 and between the source-drain regions 110, 112. The channel region 120 may extend in a straight line in the substrate 100. The channel stop region 230 may be disposed on both sides of the channel region 120.

The channel stop region 230 is a counter-doped region with respect to the source-drain regions 110, 112. That is, the channel stop region 230 may have a different conductivity type from the source-drain regions 110, 112. The source-drain regions 110, 112 may include a first dopant in a first concentration, and the channel stop region 230 may include a second dopant having an opposite conductivity type from the first dopant in a second concentration. For example, if the substrate 100 is an N-type substrate, the first dopant may include a P-type dopant, and the second dopant may include an N type dopant such as phosphorous (P) or arsenic (As). If the substrate 100 is a P-type substrate, the first dopant may include an N-type dopant, and the second dopant may include a P type dopant such as boron (B).

The channel stop region 230 may include a first channel stop region 232 and a second channel stop region 234. The first channel stop region 232 may be disposed on a first side of the straight channel region 120, and the second channel stop region 234 may be disposed on the opposite side of the channel region 120. The first channel stop region 232 and the second channel stop region 234 are illustrated as having the same size, but the inventive concepts are not limited thereto. The first gate electrode 150 may overlap a portion of the first channel stop region 232 and a portion of the second channel stop region 234, while the first gate electrode may not overlap other portions of the first channel stop region 232 and the second channel stop region 234. However, the inventive concepts are not limited thereto.

Figure 11:
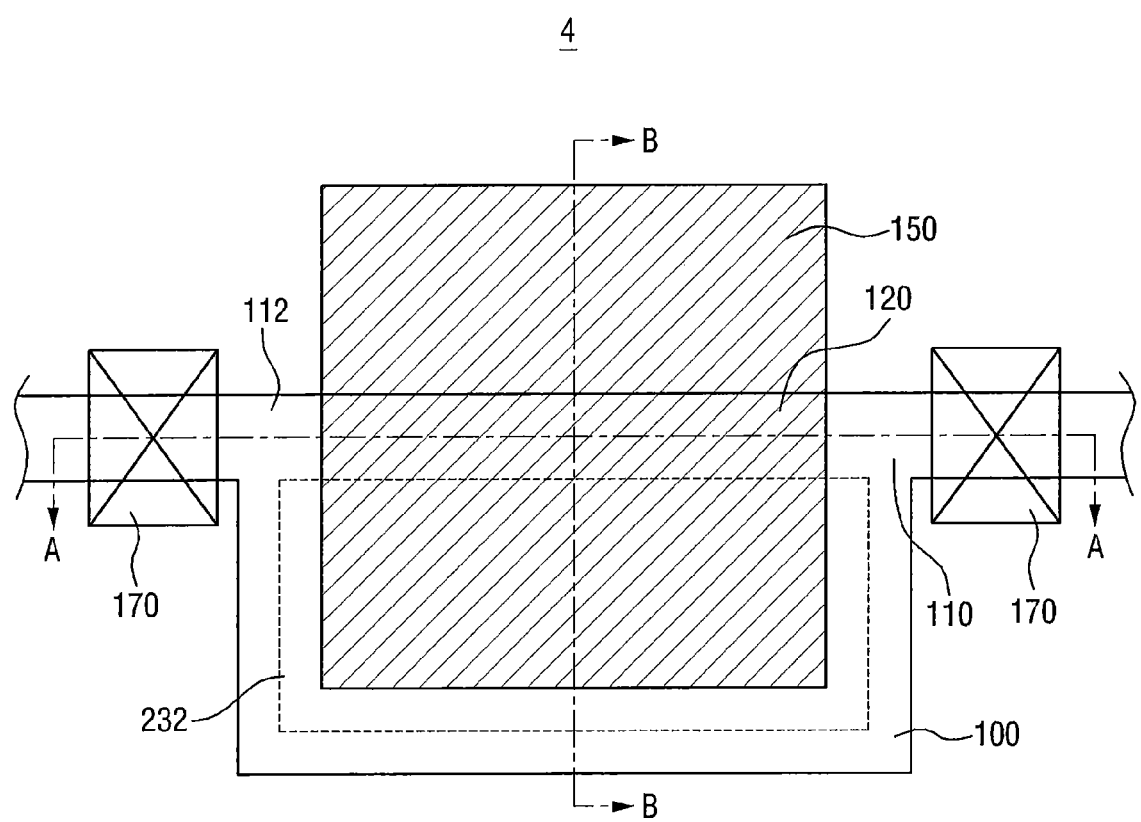
FIG. 11 is a layout view of a semiconductor device according to a fourth embodiment of the inventive concepts.

FIG. 11 is a layout view of a semiconductor device 4 according to a fourth embodiment of the inventive concepts. For simplicity, a redundant description of elements identical to elements of the above-described embodiments first through third embodiments will be omitted, and the description that follows will focus mainly on differences from the above-described embodiments.

Referring to FIG. 11, the semiconductor device 4 includes a straight channel region 120. The semiconductor device 4 may be substantially the same as the semiconductor device 3 described above with reference to FIG. 10. A cross-sectional view of the semiconductor device 4 taken along the line A-A of FIG. 11 may be substantially the same as FIG. 8. Likewise, a cross-sectional view of the semiconductor device 4 taken along the line B-B of FIG. 11 may be substantially the same as FIG. 9.

The semiconductor device 4 includes a substrate 100, the channel region 120, source-drain regions 110, 112, a channel stop region 232, a gate insulating layer 140, a first gate electrode 150, and source-drain contacts 170.

The channel stop region 232 of the semiconductor device 4 may be formed on only one side of the channel region 120, and an STI region 105 may be formed on the opposite side of the channel region 120. However, the inventive concepts are not limited thereto, and a DTI region instead of the STI region 105 can alternatively be formed on the other side of the channel region 120.

The channel stop region 232 may have a second conductivity type that is different from a first conductivity type of the source-drain regions 110, 112. The channel stop region 232 may be disposed on only one side of the straight channel region 120. The channel stop region 232 may be formed deeper in the substrate 100 than the channel region 120 and may be formed to a depth in the substrate 100 that is equal to or greater than a depth of the source-drain regions 110, 112. The channel stop region 232 may be formed to a depth in the substrate 100 that is shallower than the depth of the STI region 105 that is disposed on the other side of the channel region 120. The channel stop region 232 may be rectangular.

Figure 12:
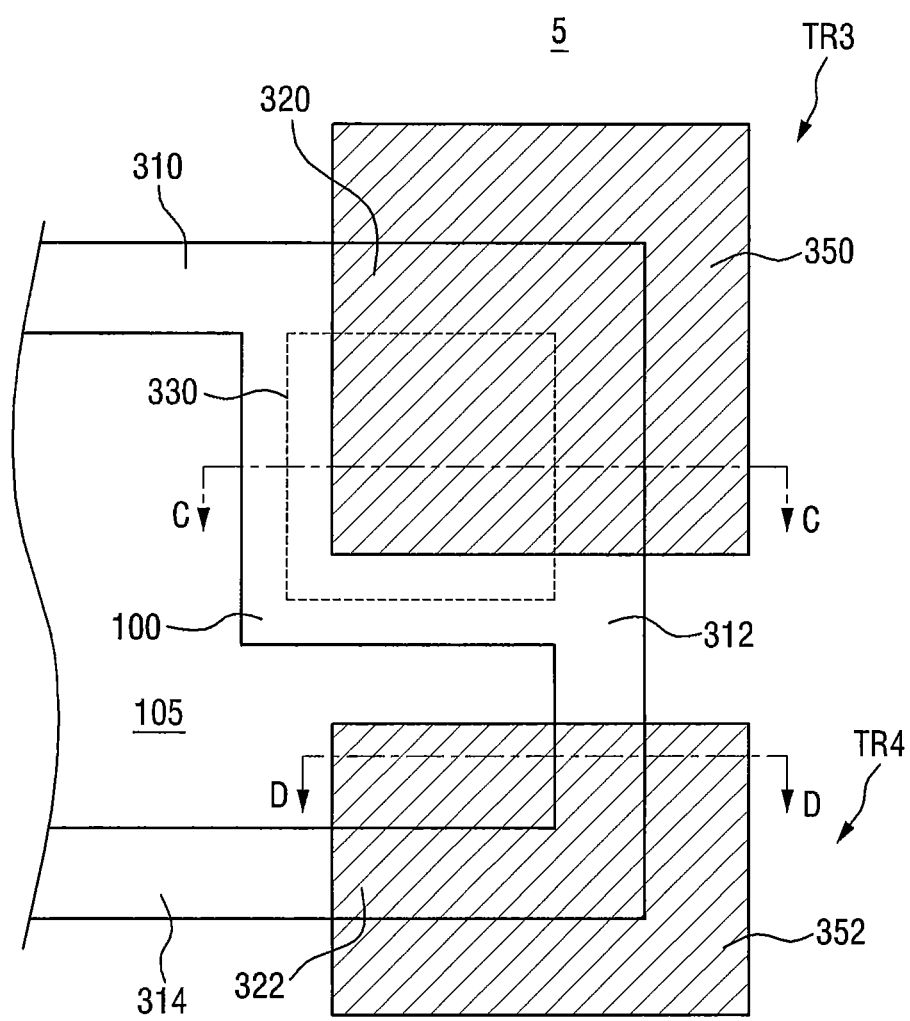
FIG. 12 is a layout view of a semiconductor device according to a fifth embodiment of the inventive concepts.
Figure 13:
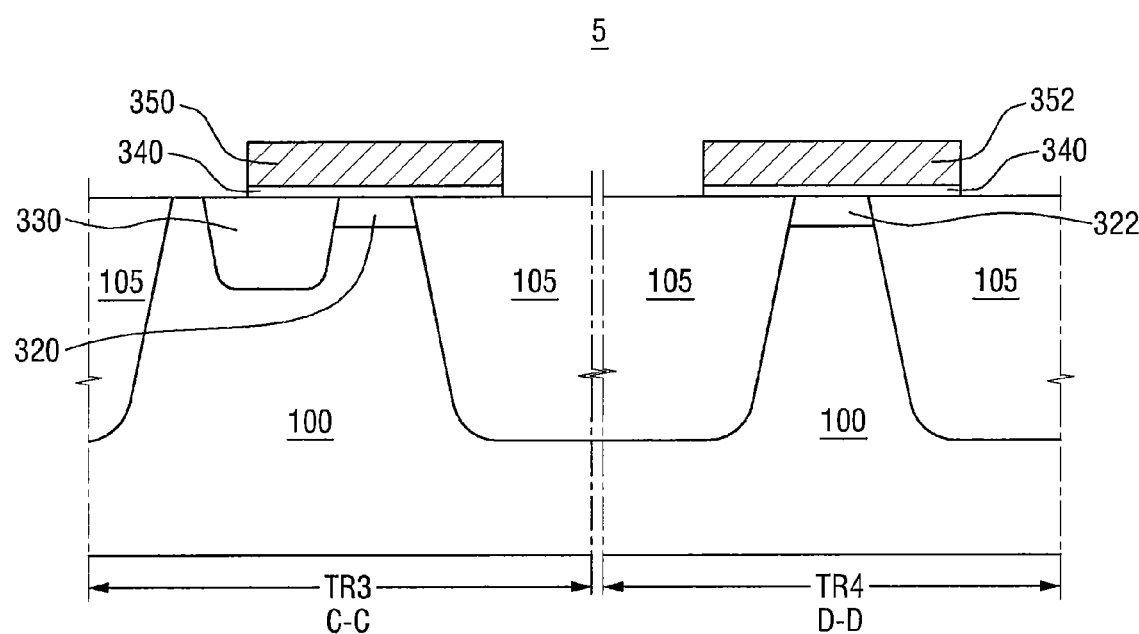
FIG. 13 is a cross-sectional view taken along the lines C-C and D-D of FIG. 12.

FIG. 12 is a layout view of a semiconductor device 5 according to a fifth embodiment of the inventive concepts. FIG. 13 is a cross-sectional view taken along the lines C-C and D-D of FIG. 12. For simplicity, a redundant description of elements identical to elements of the above-described embodiments will be omitted, and the description that follows of the fifth embodiment will focus mainly on differences from the above-described first through fourth embodiments.

Referring to FIGS. 12 and 13, the semiconductor device 5 includes a drive transistor TR3 and a select transistor TR4.

The drive transistor TR3 may include a first gate electrode 350, a first channel region 320 which is disposed under the first gate electrode 350, first source-drain regions 310, 312 which are disposed at the respective ends of the first channel region 320 and that have a first conductivity type, and a first channel stop region 330 which is disposed on a side of the first channel region 320 and which separates a photodiode (i.e., a light-receiving element) P1 (see FIG. 2) from the first channel region 320. The first channel stop region 330 has a second conductivity type that is different from the first conductivity type. The drive transistor TR3 may be substantially the same as the semiconductor devices (i.e., the transistors) 1 through 4 according to the above-described embodiments of the inventive concepts.

The first channel region 320 of the drive transistor TR3 may be bent from a first direction to a second direction that intersects the first direction. For example, the first channel region 320 may be bent at a right angle, but the inventive concepts are not limited thereto. The source-drain regions 310, 312 having the first conductivity type may be disposed at the respective ends of the first channel region 320, and the first channel stop region 330 may be disposed on a side (e.g., an inner side) of the bent first channel region 320. The first channel stop region 330 may be a counter-doped region with respect to the source-drain regions 310, 312. That is, the first channel stop region 330 may have a different conductivity type from the source-drain regions 310, 312. An STI region 105 or a DTI region may be disposed on the other side of the bent first channel region 320.

The STI region 105 may be disposed on a side of the first channel stop region 330 to be separated from the first channel stop region 330, and the first channel region 320 may be disposed on the other side of the first channel stop region 330, but the inventive concepts not limited thereto. Although not specifically illustrated in the drawing, the first channel stop region 330 and the STI region 105 may directly contact each other.

The select transistor TR4 may be gated by a select line to provide an output of the drive transistor TR3 to a column line. The select transistor TR4 includes a second gate electrode 352, a second channel region 322, and second source-drain regions 312, 314.

The second channel region 322 may be disposed under the second gate electrode 352. The second channel region 322 may be electrically connected to the first channel region 320. The second channel region 322 may be bent from the second direction to a third direction that intersects the second direction. For example, the second channel region 322 may be bent at a right angle, but the inventive concepts are not limited thereto. In addition, the third direction may be parallel to the first direction. Therefore, the first channel region 320 and the second channel region 322 may be disposed in a '⌐' shape, but the inventive concepts are not limited thereto. The source-drain regions 312, 314 may be disposed at the respective ends of the second channel region 322. An STI region 105 or a DTI region may be disposed on a first side of (e.g., an inner side) and/or on an opposing side (e.g., an outer side) of the bent second channel region 322. Thus, the STI region 105 or the DTI region can be disposed on both sides of the second channel region 322 in some embodiments. The STI region 105 or the DTI region may separate the photodiode (i.e., the light-receiving element) P1 (see FIG. 2) from the second channel region 322. The STI region 105 disposed on the first side of the first channel stop region 330 and the STI region 105 disposed on a side of the second channel stop region 322 may be integrally formed with each other, but the inventive concepts are not limited thereto.

The second gate electrode 352 may be located on the second channel region 322 and separated from the first gate electrode 350. The second gate electrode 352 may completely overlap the second channel region 322.

The second source-drain regions 312, 314 may be disposed at the respective ends of the second channel region 322 and may have the first conductivity type. The second source-drain regions 312, 314 may be formed deeper in the substrate 100 than the second channel region 322.

Figure 14:
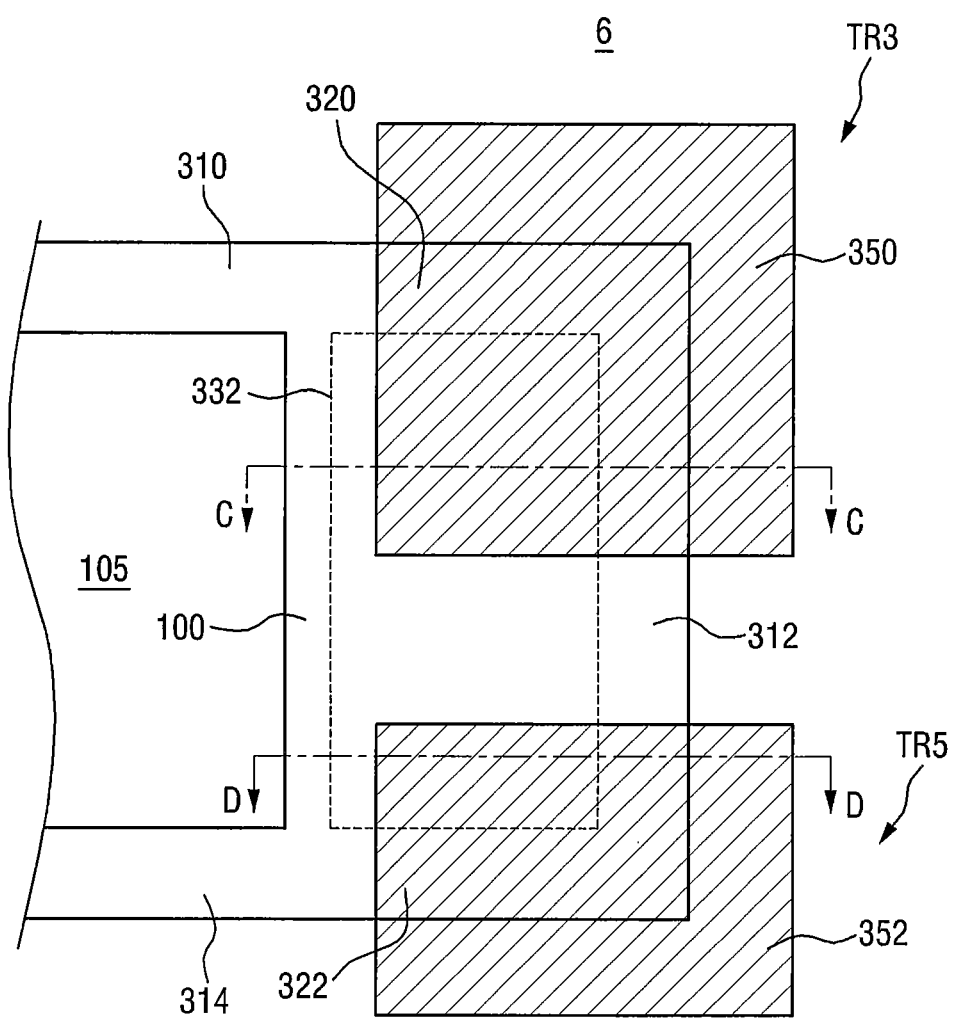
FIG. 14 is a layout view of a semiconductor device according to a sixth embodiment of the inventive concepts.
Figure 15:
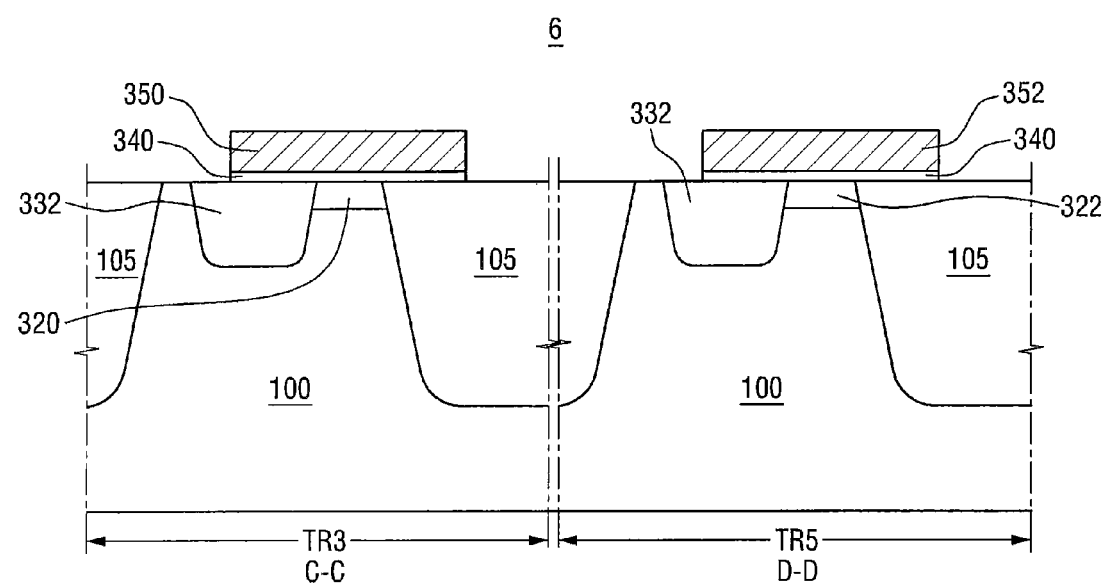
FIG. 15 is a cross-sectional view taken along the lines C-C and D-D of FIG. 14.

FIG. 14 is a layout view of a semiconductor device 6 according to a sixth embodiment of the inventive concepts. FIG. 15 is a cross-sectional view taken along the lines C-C and D-D of FIG. 14. For simplicity, a redundant description of elements identical to elements of the above-described first through fifth embodiments will be omitted, and the description of the sixth embodiment will focus mainly on differences from the above-described embodiments.

Referring to FIGS. 14 and 15, the semiconductor device 6 includes a drive transistor TR3 and a select transistor TR5. The drive transistor TR3 of the semiconductor device 6 may be substantially the same as the drive transistor TR3 of the semiconductor device 5 described above with reference to FIGS. 12 and 13.

The select transistor TR5 of the semiconductor device 6 may be substantially the same as the drive transistor TR3. That is, the select transistor TR5 includes a second gate electrode 352, a second channel region 322, second source-drain regions 312, 314, and a second channel stop region 332.

The first channel region 320 of the drive transistor TR3 and the second channel region 322 of the select transistor TR5 may be disposed in a '⌐' shape. The second channel region 322 may be bent from a second direction to a third direction and may be disposed under the second gate electrode 352. The source-drain regions 312, 314 having a first conductivity type may be disposed at the respective ends of the second channel region 322. The second channel stop region 332 may be disposed on a side of (e.g., an inner side) of the bent second channel region 322 and may be a counter-doped region with respect to the source-drain regions 312, 314. The second channel stop region 332 may have a different conductivity type from the source-drain regions 312, 314. The second channel stop region 332 may separate a photodiode (i.e., a light-receiving element) P1 (see FIG. 2) from the second channel region 322.

As illustrated in FIG. 14, a channel stop region 332 of the drive transistor TR3 and the channel stop region 332 of the select transistor TR5 may be integrally formed with each other, but the inventive concepts are not limited thereto.

An STI region 105 may be disposed on a side of the second channel stop region 332 to be separated from the second channel stop region 332, and the second channel region 322 may be disposed on the other side of the second channel stop region 332, but the inventive concepts are not limited thereto. Although not specifically illustrated in the drawings, the second channel stop region 332 and the STI region 105 may be in direct contact with each other.

An STI region 105 or a DTI region may be disposed on the other side of the bent second channel region 322, but the inventive concepts are not limited thereto.

Figure 16:
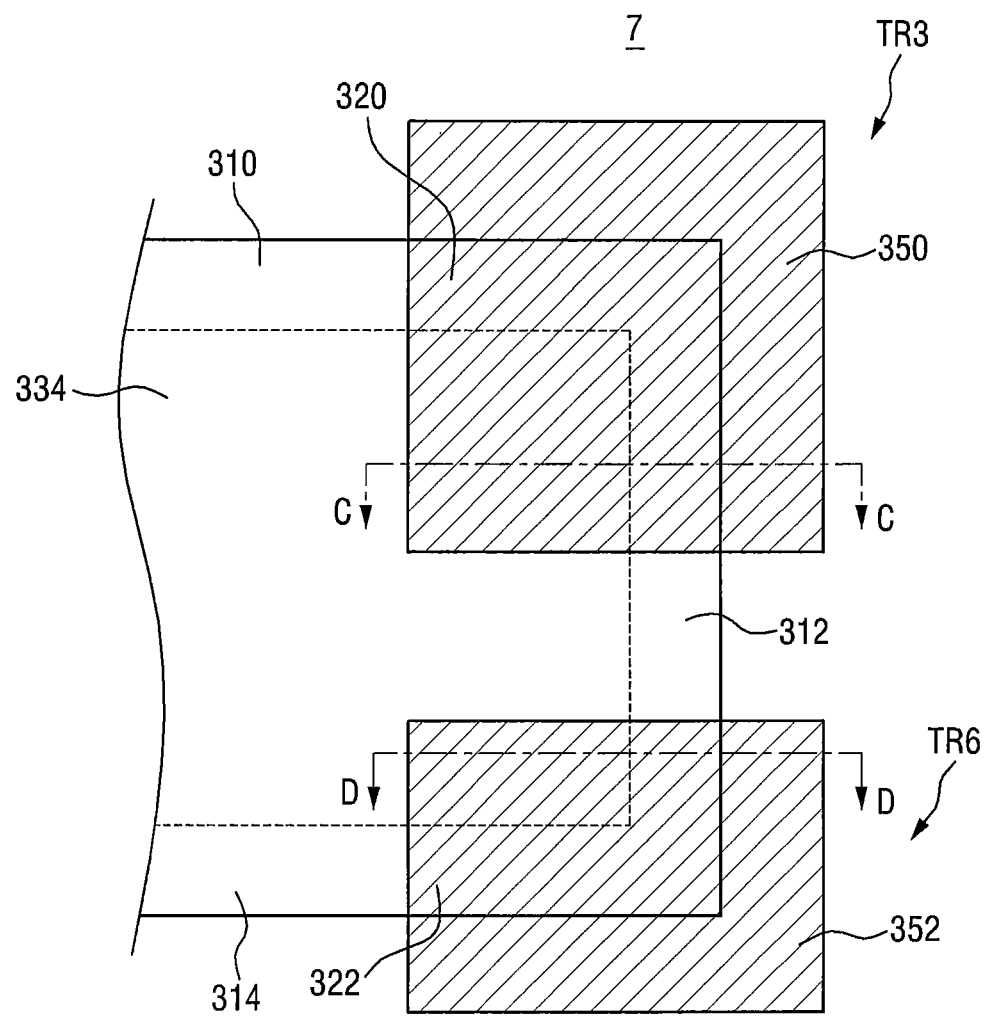
FIG. 16 is a layout view of a semiconductor device according to a seventh embodiment of the inventive concepts.
Figure 17:
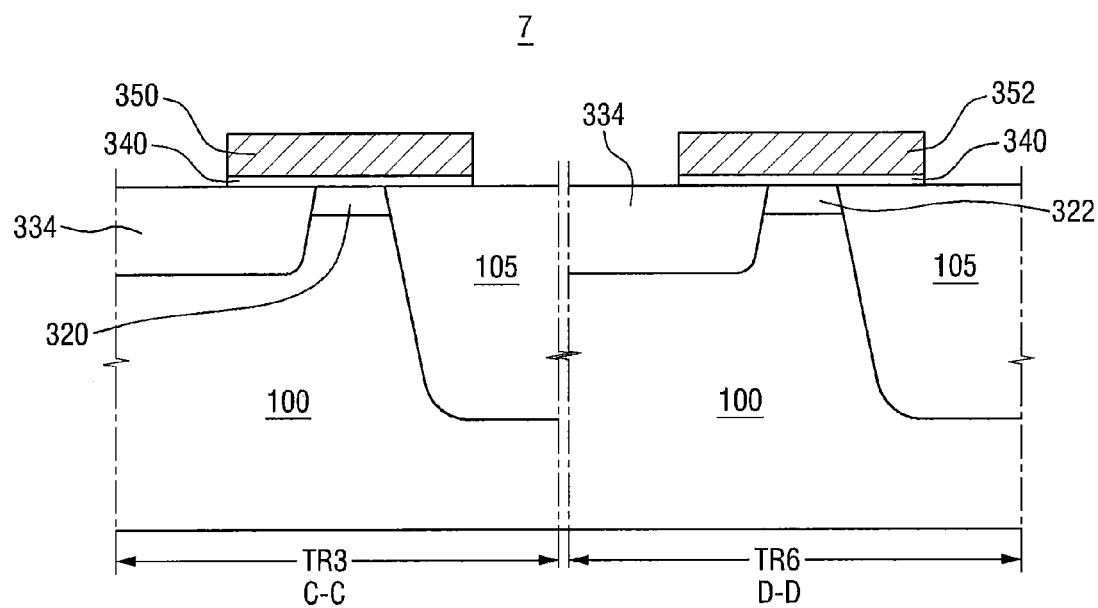
FIG. 17 is a cross-sectional view taken along the lines C-C and D-D of FIG. 16.

FIG. 16 is a layout view of a semiconductor device 7 according to a seventh embodiment of the inventive concepts. FIG. 17 is a cross-sectional view taken along the lines C-C and D-D of FIG. 16. For simplicity, a redundant description of elements identical to elements of the above-described first through sixth embodiments will be omitted, and the description of the seventh embodiment will focus mainly on differences from the above-described embodiments.

Referring to FIGS. 16 and 17, the semiconductor device 7 includes a drive transistor TR3 and a select transistor TR6. The drive transistor TR3 of the semiconductor device 7 may be substantially the same as the drive transistor TR3 of the semiconductor device 5 described above with reference to FIGS. 12 and 13. In addition, the select transistor TR6 of the semiconductor device 7 may be substantially the same as the drive transistor TR3. However, only a channel stop region 334 (not an STI region 105) may be located inside a first channel region 320 of the drive transistor TR3 and a second channel region 322 of the select transistor TR6, and the channel stop region 334 of the select transistor TR6 and the channel stop region 334 of the drive transistor TR3 may be formed integrally with each other. It will be appreciated, however, that the inventive concepts are not limited to this arrangement.

Figure 18:
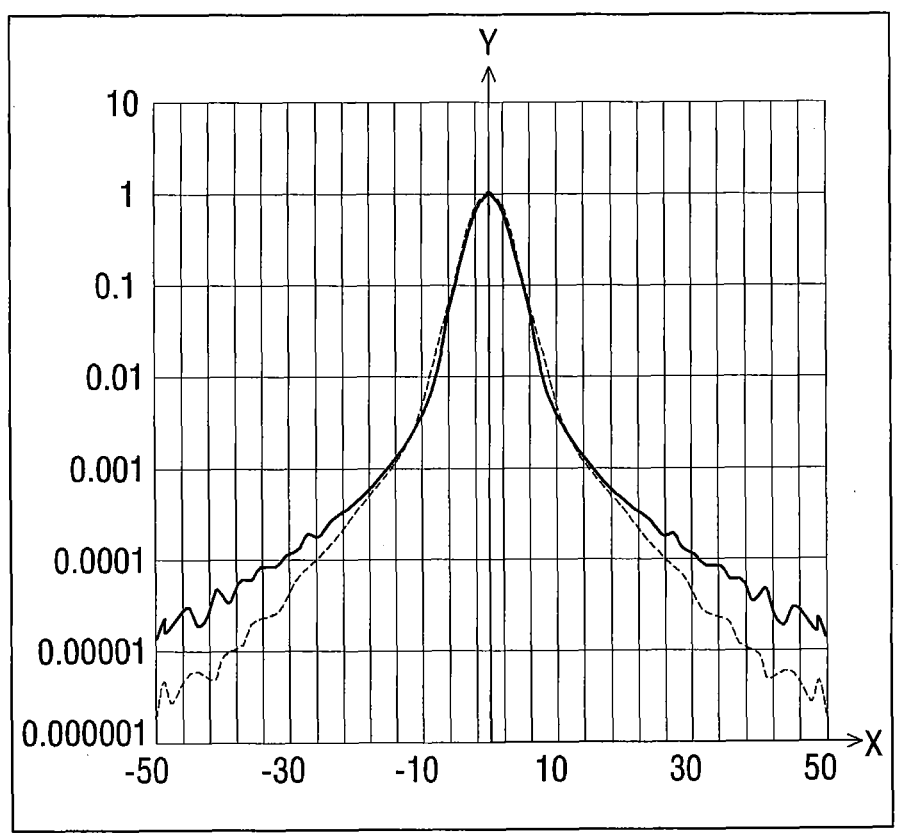
FIG. 18 is a diagram illustrating random telegraph signal (RTS) noise of semiconductor devices according to embodiments of the inventive concepts.

FIG. 18 is a diagram illustrating RTS noise of semiconductor devices according to embodiments of the inventive concepts.

Referring to FIG. 18, the X axis of the graph of FIG. 18 represents code or least significant bit (LSB), and the Y axis represents a normalized arbitrary unit. A solid line of the graph represents a semiconductor device having an STI region 105 (see FIG. 3) on both sides of a channel region 120 (see FIG. 3), and a dotted line of the graph represents an STI-free semiconductor device having a channel stop region 130 (see FIG. 3) which is counter-doped with a conductivity type different from that of a source-drain regions 110, 112 (see FIG. 3) on at least one side of the channel region 120

(see FIG. 3). Referring to the graph, the solid line representing the semiconductor device with the STI region 105 (see FIG. 3) becomes a curve having a particular value (not a normal distribution curve) toward both ends thereof due to RTS noise. On the other hand, the dotted line representing the STI-free semiconductor device becomes close to normal distribution toward both ends thereof since the STI-free semiconductor device has less RTS noise than the semiconductor device with the STI region 105 (see FIG. 3).

Referring to the table under the graph, the semiconductor device with the STI region 105 (see FIG. 3) has an RTS noise of approximately 4.06%, whereas the STI-free semiconductor device has less RTS noise. Specifically, RTS noise may be reduced to 1.85% in response to a counter doping concentration of $8e12(cm^2)$ and may be reduced up to 0.93% in response to a counter doping concentration of $2e12(cm^2)$. However, the inventive concepts are not limited thereto.

In conclusion, the STI-free semiconductor devices 1 through 7 according to the embodiments of the inventive concepts may exhibit reduced RTS noise values as compared to semiconductor devices that include the STI region 105.

Figure 19:
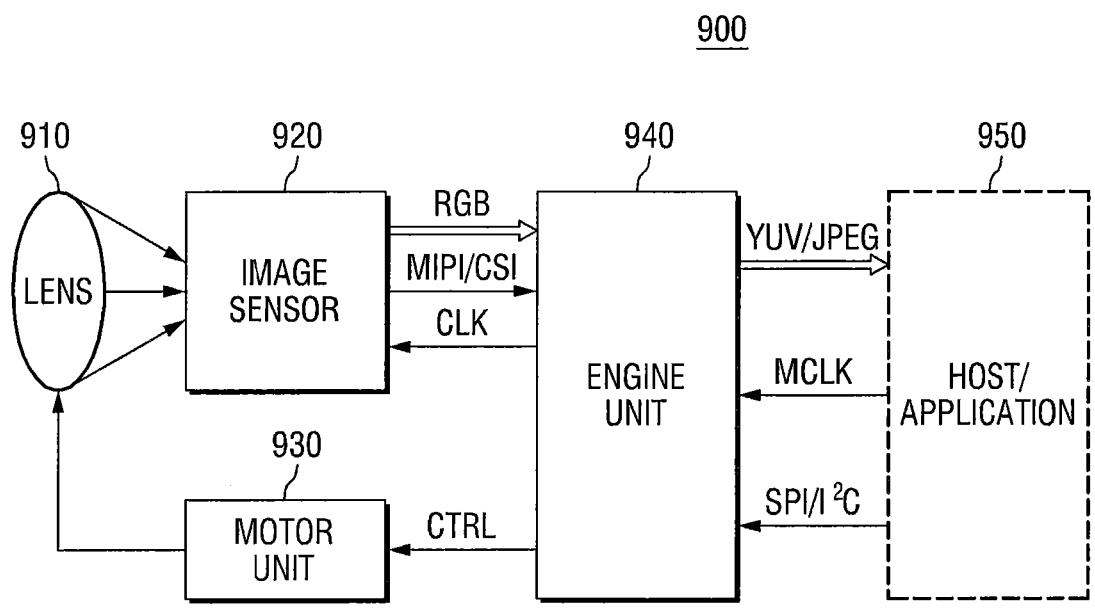
FIG. 19 is a block diagram of an image pickup device according to another embodiment of the inventive concepts.

FIG. 19 is a block diagram of an image pickup device 900 according to another embodiment of the inventive concepts.

Referring to FIG. 19, the image pickup device 900 may include a lens 910, an image sensor 920, a motor unit 930, and an engine unit 940. The image sensor 920 may include one or more of the semiconductor devices 1 through 7 according to the above-described embodiments of the inventive concepts.

The lens 910 focuses incident light onto a light-receiving region of the image sensor 920. The image sensor 920 may generate RGB data RGB of a Bayer pattern based on the light received through the lens 910. The image sensor 920 may provide the RGB data RGB based on a clock signal CLK.

In some embodiments, the image sensor 920 may interface with the engine unit 940 using a mobile industry processor interface (MIPI) and/or a camera serial interface (CSI).

The motor unit 930 may adjust the focus of the lens 910 or perform shuttering in response to a control signal CTRL received from the engine unit 940. The engine unit 940 may control the image sensor 920 and the motor unit 930. In addition, the engine unit 940 may generate YUV data YUV including a luminance component, a difference between the luminance component and a blue component and a difference between the luminance component and a red component or generate compressed data, e.g., Joint Photography Experts Group (JPEG) data based on the RGB data RGB received from the image sensor 920.

The engine unit 940 may be connected to a host/application 950 and may provide the YUV data YUV or the JPEG data to the host/application 950 based on a master clock MCLK. In addition, the engine unit 940 may interface with the host/application 950 using a serial peripheral interface (SPI) and/or an inter-integrated circuit ($I^2C$).

Figure 20:
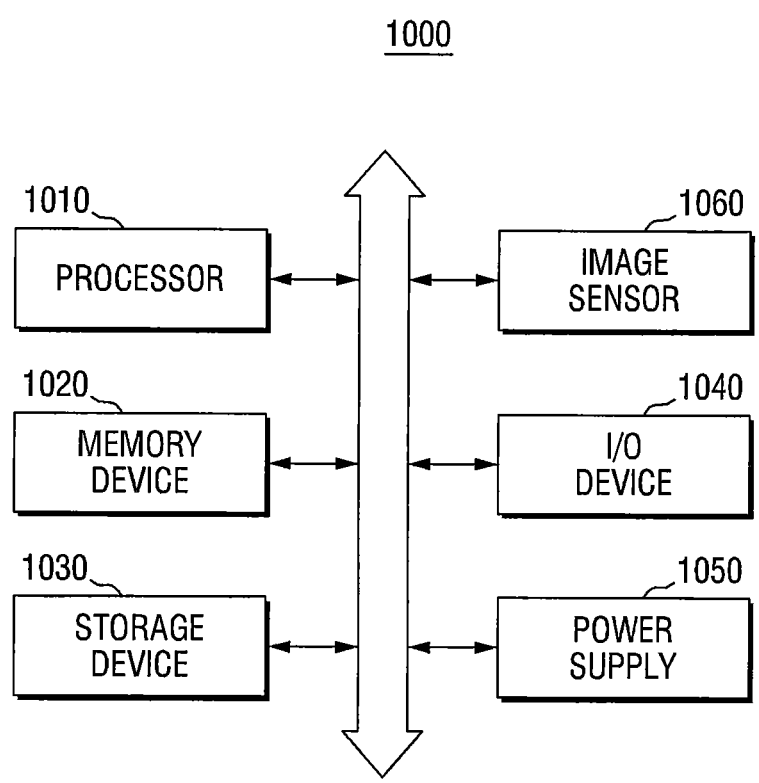
FIG. 20 is a block diagram of an example computing system using image pickup devices according to embodiments of the inventive concepts.

FIG. 20 is a block diagram of an example computing system 1000 using image pickup devices according to embodiments of the inventive concepts.

Referring to FIG. 20, the computing system 1000 may include a processor 1010, a memory device 1020, a storage device 1030, an input/output (I/O) device 1040, a power supply 1050, and an image sensor 1060.

The image sensor 1060 may include one or more of the semiconductor devices 1 through 7 according to the above-described embodiments of the inventive concepts. Although not illustrated in FIG. 20, the computing system 1000 may further include ports that can communicate with a video card, a sound card, a memory card, a USB device, or other electronic devices.

The processor 1010 may perform certain calculations or tasks. Depending on embodiments, the processor 1010 may be a microprocessor or a central processing unit (CPU).

The processor 1010 may communicate with the memory device 1020, the storage device 1030 and the I/O device 1040 through an address bus, a control bus, and a data bus.

Depending on embodiments, the processor 1010 may be coupled to an extended bus such as a peripheral component interconnection (PCI) bus. The memory device 1020 may store data required for the operation of the computing system 1000.

For example, the memory device 1020 may be implemented as a dynamic random access memory (DRAM), a mobile DRAM, a static random access memory (SRAM), a phase random access memory (PRAM), a ferroelectric random access memory (FRAM), a resistive random access memory (RRAM), and/or a magnetic random access memory (MRAM). The storage device 1030 may include a solid state drive (SSD), a hard disk drive (HDD), a CD-ROM, etc.

The I/O device 1040 may include an input device (e.g., a keyboard, a keypad, a mouse, etc.) and an output device (e.g., a printer, a display, etc.). The power supply 1050 may supply an operating voltage required for the operation of the computing system 1000.

The image sensor 1060 may be connected to and communicate with the processor 1010 via buses or other communication links. The image sensor 1060 and the processor 1010 may be integrated together onto a single chip or may be integrated separately onto different chips.

The computing system 1000 may be any type of computing system using an image sensor. For example, the computing system 1000 may be a digital camera, a mobile phone, a personal digital assistant (PDA), a portable multimedia player (PMP), a smart phone, a table PC, etc.

In some embodiments of the inventive concepts, the computing system 1000 may be provided as an ultra mobile PC (UMPC), a work station, a net-book computer, a portable computer, a wireless phone, a mobile phone, an e-book, a portable game console, a navigation device, a black box, a 3-dimensional television set, a digital audio recorder, a digital audio player, a digital picture recorder, a digital picture player, a digital video recorder, a digital video player, etc.

Figure 21:
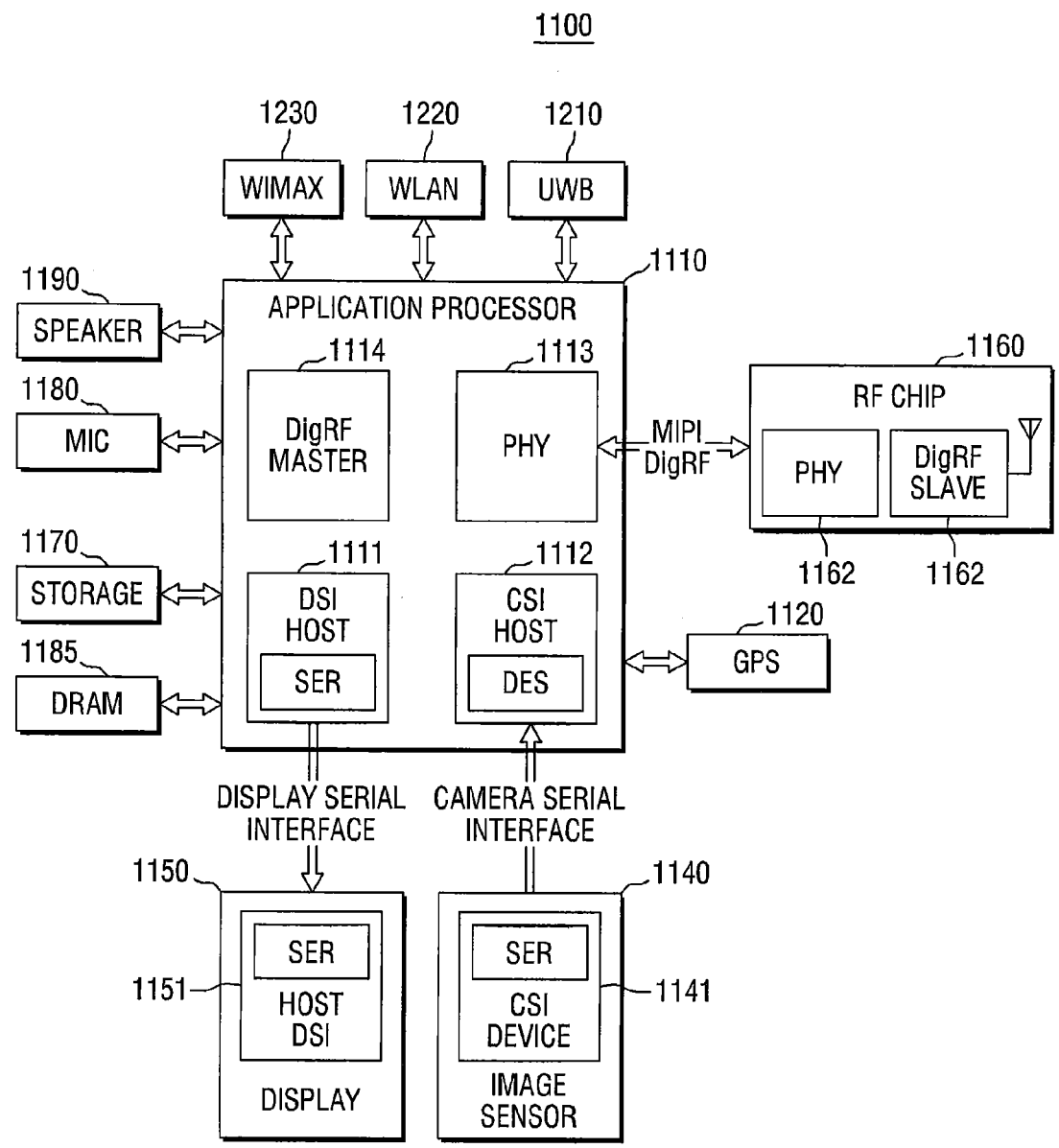
FIG. 21 is a block diagram of a computing system according to further embodiments of the inventive concepts.

FIG. 21 is a block diagram of a computing system 1100 according to further embodiments of the inventive concepts.

Referring to FIG. 21, the computing system 1100 may be implemented as a data processing device that can use or support the MIPI. The computing system 1100 may include an application processor 1110, an image sensor 1140 and a display 1150.

A CSI host 1112 of the application processor 1110 may perform serial communication with a CSI device 1141 of the image sensor 1140 via a CSI.

In some embodiments of the inventive concepts, the CSI host 1112 may include a deserializer (DES), and the CSI device 1141 may include a serializer (SER). A display serial interface (DSI) host 1111 of the application processor 1110 may perform serial communication with a DSI device 1151 of the display 1150 via a DSI.

In some embodiments of the inventive concepts, the DSI host 1111 may include a SER, and the DSI device 1151 may include a DES. The computing system 1100 may further include a radio frequency (RF) chip 1160 which can communicate with the application processor 1110. A physical layer (PHY) 1113 of the computing system 1100 and a PHY 1161 of the RF chip 1160 may perform data communications based on a MIPI DigRF.

The application processor 1110 may further include a DigRF MASTER 1114 which controls the data communication of the PHY 1161 based on the MIPI DigRF. The computing system 1100 may further include a global positioning system (GPS) 1120, a storage 1170, a microphone 1180, a DRAM 1185, and a speaker 1190. In addition, the computing system 1100 may perform communications using an ultra wideband (UWB) 1210, a wireless local area network (WLAN) 1220, a worldwide interoperability for microwave access (WIMAX) 1230, etc. However, the above structure and interfaces of the computing system 1100 are merely an example, and the inventive concepts are not limited to this example.

While the inventive concepts have been particularly shown and described with reference to exemplary embodiments thereof, it will be understood by those of ordinary skill in the art that various changes in form and details may be made therein without departing from the spirit and scope of the inventive concepts as defined by the following claims. It is therefore desired that the present embodiments be considered in all respects as illustrative and not restrictive, reference being made to the appended claims rather than the foregoing description to indicate the scope of the invention.

What is claimed is:

1. A semiconductor device comprising:
    a light-receiving element which outputs electric charges in response to incident light; and
    a drive transistor which is gated by an output of the light-receiving element to generate a source-drain current that is proportional to the incident light,
    wherein the drive transistor comprises:
        a first gate electrode;
        a first channel region under the first gate electrode;
        first and second source-drain regions which are disposed at respective ends of the first channel region, the first and second source-drain regions having a first conductivity type; and
        a first channel stop region on a first side of the first channel region, the first channel stop region having a second conductivity type that is different from the first conductivity type,
    wherein the first and second source-drain regions each include a first dopant, and the first channel stop region includes a second dopant, wherein a concentration of the first dopant in the first and second source-drain regions exceed a concentration of the second dopant in the first channel stop region.

2. The semiconductor device of claim 1, wherein the first channel stop region is between the first channel region and the light receiving element.

3. The semiconductor device of claim 1, wherein the first channel region includes a first segment under the first gate electrode that extends in a first direction and a second segment under the first gate electrode that extends in a second direction that intersects the first direction, and the first channel stop region is positioned between the first source/drain region and the second source/drain region.

4. The semiconductor device of claim 1, wherein the first gate electrode is on a top surface of the first channel region, a first side surface of the first channel region directly contacts a first side of the first channel stop region, and a shallow trench isolation (STI) region directly contacts a second side of the first channel stop region that is opposite the first side of the first channel stop region.

5. The semiconductor device of claim 1, wherein a second channel stop region is on a second side of the first channel region that is opposite the first side of the first channel region.

6. The semiconductor device of claim 1, wherein the first channel stop region is disposed on only one side of the first channel region, and a shallow trench isolation (STI) region or deep trench isolation (DTI) region is on a second side of the first channel region that is opposite the first side of the first channel region.

7. The semiconductor device of claim 6, wherein the drive transistor is formed in a substrate, and wherein a first depth of the first channel stop region into the substrate is smaller than a second depth of the STI region into the substrate.

8. The semiconductor device of claim 1, further comprising a select transistor which is gated by a select line to provide an output of the drive transistor to a column line, wherein the select transistor comprises:
    a second gate electrode;
    a second channel region under the second gate electrode;
    a third source-drain region which is at a first a first end of the second channel region and that has the first conductivity type; and
    a second channel stop region on a first side of the second channel region, the second channel stop region having the second conductivity type,
    wherein the second source-drain region is at a second end of the second channel region that is opposite the first end of the second channel region.

9. The semiconductor device of claim 8, further comprising a shallow trench isolation (STI) or deep trench isolation (DTI) region on a second other side of the second channel region that is opposite the first side of the second channel region.

10. A semiconductor device comprising:
    a first channel region in a substrate that has a first segment that extends in a first direction and a second segment that extends in a second direction that intersects the first direction;
    a second channel region which is electrically connected to the first channel region, the second channel region including a segment that extends in a third direction that intersects the second direction;
    a first gate electrode on the first channel region;
    a second gate electrode on the second channel region, the second gate electrode separated from the first gate electrode;
    a first source-drain region at a first end of the first channel region, a second source-drain at a second end of the second channel region and a third source-drain region between the first channel region and the second channel region, the first, second and third source-drain regions having a first conductivity type; and
    a first channel stop region on a first side of a bent portion of the first channel region that has a second conductivity type that is different from the first conductivity type,
    wherein the first source/drain region is on a first side of the first gate electrode and the second source/drain region is on a second side of the first gate electrode that is adjacent the first side,
    wherein the first channel stop region is disposed on only one side of the first channel region, and a shallow trench isolation (STI) or deep trench isolation (DTI) region is disposed on the opposite side of the first channel region.

11. The semiconductor device of claim 10, further comprising a second channel stop region which is disposed on a side of the bent portion of the second channel region and that has the second conductivity type.

12. The semiconductor device of claim 10, wherein the first gate electrode is larger than the first channel region and overlaps both the first channel region and the first channel stop region.

13. A semiconductor device, comprising:
a substrate having a channel region having a first conductivity type therein;
a first source-drain region at a first end of the channel region;
a second source-drain region at a second end of the channel region that is opposite the first end of the channel region; and
a first channel stop region in the substrate on a first side of the channel region that has a second conductivity type that is opposite the first conductivity type,
wherein the first channel stop region is positioned between the first source/drain region and the second source/drain region, and
a trench isolation region on a second side of the channel region that is opposite the first side of the channel region, the first channel stop region directly contacting a first side surface of the first channel region and the trench isolation region directly contacting a second side surface of the first channel region.

14. The semiconductor device of claim 13, further comprising a second channel stop region on a second side of the channel region that is opposite the first side of the channel region, wherein the second channel stop region is not positioned between the first source/drain region and the second source/drain region.

15. The semiconductor device of claim 13, wherein the channel region has a constant width and is a bent channel region that has a first section and a second section that are not collinear with each other.

16. The semiconductor device of claim 10, wherein the first and second source-drain regions each include a first dopant, and the first channel stop region includes a second dopant, wherein a concentration of the second dopant in the first channel region exceeds concentrations of the first dopants in the first and second source-drain regions.

17. The semiconductor device of claim 13, wherein the first and second source-drain regions each include a first dopant, and the first channel stop region includes a second dopant, wherein a concentration of the second dopant in the first channel region exceeds concentrations of the first dopants in the first and second source-drain regions.

18. The semiconductor device of claim 13, wherein the first channel stop region is disposed on only one side of the first channel region, and a shallow trench isolation (STI) or deep trench isolation (DTI) region is disposed on the opposite side of the first channel region.

* * * * *